United States Patent
Futase et al.

(10) Patent No.: US 8,222,133 B2
(45) Date of Patent: Jul. 17, 2012

(54) MANUFACTURING METHOD OF SEMICONDUCTOR DEVICE

(75) Inventors: Takuya Futase, Tokyo (JP); Takeshi Hayashi, Tokyo (JP)

(73) Assignee: Renesas Electronics Corporation, Kanagawa (JP)

(*) Notice: Subject to any disclaimer, the term of this patent is extended or adjusted under 35 U.S.C. 154(b) by 1308 days.

(21) Appl. No.: 11/873,449

(22) Filed: Oct. 17, 2007

(65) Prior Publication Data

US 2008/0176396 A1  Jul. 24, 2008

(30) Foreign Application Priority Data

Oct. 17, 2006  (JP) ................................. 2006-282100

(51) Int. Cl.
*H01L 21/44* (2006.01)
(52) U.S. Cl. .................... 438/597; 438/598; 438/629
(58) Field of Classification Search .................. 438/296, 438/586, 597, 598, 629
See application file for complete search history.

(56) References Cited

U.S. PATENT DOCUMENTS

| | | | |
|---|---|---|---|
| 6,171,717 B1 * | 1/2001 | Chang et al. | 428/698 |
| 6,215,144 B1 * | 4/2001 | Saito et al. | 257/310 |
| 6,403,478 B1 * | 6/2002 | Seet et al. | 438/672 |
| 7,465,624 B2 * | 12/2008 | Nakajima et al. | 438/233 |
| 7,538,397 B2 * | 5/2009 | Kotani | 257/380 |
| 2005/0031786 A1 * | 2/2005 | Lee et al. | 427/255.28 |

FOREIGN PATENT DOCUMENTS

| | | |
|---|---|---|
| JP | 2004-363402 | 12/2004 |
| JP | 2005-079543 | 3/2005 |
| JP | 2006-179645 | 7/2006 |

* cited by examiner

*Primary Examiner* — Kevin M Picardat
(74) *Attorney, Agent, or Firm* — Antonelli, Terry, Stout & Kraus, LLP.

(57) ABSTRACT

An object of the invention is to avoid an inconvenience at a connection portion formed by filling a metal film in a connecting hole, which has been opened in an insulating film, via a barrier metal film having a titanium nitride film stacked over a titanium film. A manufacturing method of a semiconductor device has the steps of: forming a thermal reaction Ti film over the bottom of a connecting hole by a thermal reaction using a $TiCl_4$ gas; forming a plasma reaction Ti film by a plasma reaction using a $TiCl_4$ gas; forming a nitrogen-rich TiN film over the surface of the plasma reaction Ti film by plasma treatment with $H_2$ and plasma treatment with $NH_3$ gases; repeatedly carrying out film formation by CVD using a $WF_6$ gas and reduction using an $SiH_4$ or $B_2H_6$ gas to form a tungsten nucleation film of a multilayer structure over the nitrogen-rich TiN film; and forming a blanket•tungsten film at 400° C. or less by CVD using $WF_6$ and $H_2$ gases. This makes it possible to avoid an inconvenience at a connection portion formed by filling a metal film in a connecting hole, which has been opened in an insulating film, via a barrier metal film having a titanium nitride film stacked over a titanium film.

48 Claims, 17 Drawing Sheets

FIG. 7

| Step | 1 | 2 | 3 | 4 | 5 | 6 | 7 | 8 | 9 | 10 |
|---|---|---|---|---|---|---|---|---|---|---|
| Comment | Gas Ramp | Preheat | TiCl4 Diverting | TiCl4 Soaking | Ti Depo. | H2 Plasma | Purge | NH3 Flow | NH3 Plasma | Vacuum |
| Time(sec) | 5 | 21 | 8 | 5~30 | | | 5 | 10 | | 5 |
| Ar(sccm) | 800 | 800 | 800 | 800 | 800 | 800 | 800 | 800 | 800 | 800 |
| H2(sccm) | 4000 | 4000 | 4000 | 4000 | 4000 | 4000 | 4000 | 4000 | 4000 | 4000 |
| TiCl4(sccm) | 0 | 0 | 6.7 | 6.7 | 6.7 | 0 | 0 | 0 | 0 | 0 |
| | | | divert chamber | chamber | chamber | | | | | |
| NH3(sccm) | 0 | 0 | 0 | 0 | 0 | 0 | 0 | 500 | 500 | 0 |
| Press(Pa) | 0→666.6 | 666.6 | 666.6 | 666.6 | 666.6 | 666.6 | 666.6 | 666.6 | 666.6 | 0 |
| RF Power(W) | 0 | 0 | 0 | 0 | 800 | 800 | 0 | 0 | 800 | 0 |

FIG. 8

| Step | 1 | 2 | 3 | 4 | 5 | 6 | 7 | 8 | 9 | 10 | 11 | 12 | 13 |
|---|---|---|---|---|---|---|---|---|---|---|---|---|---|
| Comment | Gas Ramp | Preheat | TiCl4 Diverting | TiCl4 Soaking | Ti Depo. | H2 Plasma | TiCl4 Diverting | Ti Depo. | H2 Plasma | Purge | NH3 Flow | NH3 Plasma | Vacuum |
| Time(sec) | 5 | 21 | 8 | 5~30 | | | 8 | | | 5 | 10 | | 5 |
| Ar(sccm) | 800 | 800 | 800 | 800 | 800 | 800 | 800 | 800 | 800 | 800 | 800 | 800 | 800 |
| H2(sccm) | 4000 | 4000 | 4000 | 4000 | 4000 | 4000 | 4000 | 4000 | 4000 | 4000 | 4000 | 4000 | 4000 |
| TiCl4(sccm) | 0 | 0 | 6.7 | 6.7 | 6.7 | 0 | 6.7 | 6.7 | 0 | 0 | 0 | 0 | 0 |
| | | | divert | chamber | chamber | | divert | chamber | | | | | |
| NH3(sccm) | 0 | 0 | 0 | 0 | 0 | 0 | 0 | 0 | 0 | 0 | 500 | 500 | |
| Press(Pa) | 0→666.6 | 666.6 | 666.6 | 666.6 | 666.6 | 666.6 | 666.6 | 666.6 | 666.6 | 666.6 | 666.6 | 666.6 | 0 |
| RF Power(W) | 0 | 0 | 0 | 0 | 800 | 800 | 0 | 800 | 800 | 0 | 0 | 800 | 0 |

FIG. 9

| Step | 1 | 2 | 3 | 4 | 5 | 6 | 7 | 8 | 9 | 10 |
|---|---|---|---|---|---|---|---|---|---|---|
| Comment | Gas Ramp | Preheat | TiCl4 Diverting | TiCl4 Soaking | Ti Depo. | H2 Plasma | Purge | NH3 Flow | NH3 Plasma | Vacuum |
| Time(sec) | 5 | 21 | 8 | 5~30 | | | 5 | 10 | | 5 |
| Ar(sccm) | 800 | 800 | 800 | 800 | 800 | 800 | 800 | 800 | 800 | 800 |
| H2(sccm) | 4000 | 4000 | 4000 | 4000 | 4000 | 4000 | 4000 | 4000 | 4000 | 4000 |
| TiCl4(sccm) | 0 | 0 | divert chamber | 6.7 | 6.7 | 0 | 0 | 0 | 0 | 0 |
| NH3(sccm) | 0 | 0 | 0 | 0 | 0 | 0 | 0 | 500 | 500 | 0 |
| Press(Pa) | 0→666.6 | 666.6 | 666.6 | 666.6 | 666.6 | 666.6 | 666.6 | 666.6 | 666.6 | 0 |
| RF Power(W) | 0 | 0 | 0 | 0 | 800 | 800 | 0 | 0 | 800 | 0 |

| Step | 11 | 12 | 13 | 14 | 15 | 16 | 17 |
|---|---|---|---|---|---|---|---|
| Comment | TiCl4 Diverting | Ti Depo. | H2 Plasma | Purge | NH3 Flow | NH3 Plasma | Vacuum |
| Time(sec) | 8 | | | 5 | 10 | | 5 |
| Ar(sccm) | 800 | 800 | 800 | 800 | 800 | 800 | 800 |
| H2(sccm) | 4000 | 4000 | 4000 | 4000 | 4000 | 4000 | 4000 |
| TiCl4(sccm) | divert chamber | 6.7 | 0 | 0 | 0 | 0 | 0 |
| NH3(sccm) | 0 | 0 | 0 | 0 | 500 | 500 | |
| Press(Pa) | 666.6 | 666.6 | 666.6 | 666.6 | 666.6 | 666.6 | 0 |
| RF Power(W) | 0 | 800 | 800 | 0 | 0 | 800 | 0 |

FIG. 14

| Step | 1 | 2 | 3 | 4 | 5 | 6 | 7 | 8 | 9 | 10 | 11 | 12 |
|---|---|---|---|---|---|---|---|---|---|---|---|---|
| Comment | Gas Ramp | Preheat | TiCl4 Diverting | Diverting | Stab | TiCl4 Flow | Depo. | TiCl4 Flow | NH3 Diverting | NH3 Flow | Purge | Vacuum |
| Time(sec) | 5 | 30 | 10 | 4 | 1 | 0.5 | 6 | 2 | 2 | 5 | 10 | 5 |
| TiCl4(sccm) | 0 | 0 | 60 | 60 | 60 | 60 | 60 | 60 | 0 | 0 | 0 | 0 |
| | | | divert | divert | divert | chamber | chamber | chamber | | | | |
| TiCl4 system Carrier N2 (sccm) | 500 | 500 | 200 | 1800 | 170 | 170 | 170 | 1800 | 1000 | 200 | 1000 | 0 |
| NH3(sccm) | 60 | 60 | 4500 | 60 | 60 | 60 | 60 | 0 | 1000 | 4500 | 0 | 0 |
| | chamber | chamber | chamber | divert | divert | divert | chamber | | divert | chamber | | |
| NH3 system Carrier N2 (sccm) | 500 | 500 | 200 | 1800 | 170 | 170 | 170 | 1800 | 1000 | 200 | 1000 | 0 |
| Press(Pa) | 0→650 | 650 | 260 | 260 | 260 | 260 | 260 | 260 | 260 | 260 | 80 | 0 |

FIG. 16

| Step | 1 | 2 | 3 | 4 | 5 | 6 |
|---|---|---|---|---|---|---|
| Comment | preflow | Nuc. | purge | preflow | viafill | vacuum |
| Time(sec) | 5 | A1 | 15 | 5 | A2 | 3 |
| press(Pa) | 2667 | 2667 | 10666 | 10666 | 10666 | 0 |
| temp.(°C) | 390 | 390 | 390 | 390 | 390 | 390 |
| L01:WF6(sccm) | 50 | 50 | 0 | 250 | 250 | 0 |
| L03:Ar(sccm) | 4500 | 4500 | 7000 | 4000 | 4000 | 4000 |
| L04:SiH4(sccm) | 40 | 40 | 0 | 0 | 0 | 0 |
| L05:H2(sccm) | 900 | 900 | 2200 | 2200 | 2200 | 2200 |
| L06:N2(sccm) | 1350 | 1350 | 2000 | 200 | 200 | 200 |
| L07:BSAr(sccm) | 1000 | 1000 | 2000 | 2000 | 2000 | 2000 |
| L08:H2(sccm) | 0 | 0 | 1700 | 1700 | 1700 | 1700 |
| L01: WF6 flow mode | divert | chamber | | divert | | |
| L04: SiH4 flow mode | divert | chamber | | | | |

*L01 to L08 represent the number of a gas line system to a chamber.

FIG. 17

| Step | 1 | 2 | 3 | 4 | 5 | 6 | 7 | 8 | 9 |
|---|---|---|---|---|---|---|---|---|---|
| Comment | WF6 flow | purge | SiH4 flow | purge | preflow | passivate | press up | main | vacuum |
| Time(sec) | 1.5 | 1.5 | 1.5 | 1.5 | 3 | 11 | 40 | | 3 |
| press(Pa) | 1000 | 1000 | 1000 | 1000 | 1000 | 1000 | 10666 | 10666 | 0 |
| temp.(°C) | 350 | 350 | 350 | 350 | 350 | 350 | 390 | 390 | 390 |
| L01:WF6(sccm) | 160 | 0 | 160 | 160 | 60 | 60 | 350 | 350 | 0 |
| L03:Ar(sccm) | 6000 | 6000 | 6000 | 6000 | 6000 | 6000 | 4000 | 4000 | 4000 |
| L04:SiH4(sccm) | 400 | 400 | 0 | 0 | 0 | 0 | 0 | 0 | 0 |
| L05:H2(sccm) | 0 | 0 | 0 | 0 | 4000 | 4000 | 4000 | 2200 | 2200 |
| L06:N2(sccm) | 2000 | 2000 | 2000 | 2000 | 2000 | 2000 | 2000 | 200 | 200 |
| L07:BSAr(sccm) | 2000 | 1 | 1 | 2000 | 2000 | 2000 | 2000 | 2000 | 2000 |
| L08:H2(sccm) | 0 | 0 | 0 | 0 | 0 | 0 | 0 | 1700 | 1700 |
| L01: WF6 flow mode | chamber | | divert | divert | divert | chamber | chamber | chamber | |
| L04: SiH4 flow mode | divert | divert | chamber | | | | | | |

*L01 to L08 represent the number of a gas line system to a chamber.

FIG. 18

| Step | 1 | 2 | 3 | 4 | 5 | 6 | 7 | 8 | 9 | 10 |
|---|---|---|---|---|---|---|---|---|---|---|
| Comment | WF6 flow | purge | B2H6 flow | purge | stab | preflow | passivate | press up | main | vacuum |
| Time(sec) | 1.5 | 1.5 | 3 | 1.5 | 1.5 | 1.5 | 11 | 40 | | 3 |
| press(Pa) | 1000 | 1000 | 1000 | 1000 | 1000 | 1000 | 1000 | 10666 | 10666 | 0 |
| temp.(°C) | 350 | 350 | 350 | 350 | 350 | 350 | 350 | 390 | 390 | 390 |
| L01:WF6(sccm) | 160 | 0 | 0 | 160 | 0 | 60 | 60 | 200 | 200 | 0 |
| L03:Ar(sccm) | 6000 | 6000 | 6000 | 6000 | 6000 | 6000 | 6000 | 2000 | 2000 | 2000 |
| L05:H2(sccm) | 0 | 0 | 0 | 0 | 4000 | 4000 | 4000 | 4000 | 2200 | 2200 |
| L06:N2(sccm) | 2000 | 2000 | 2000 | 2000 | 2000 | 2000 | 2000 | 2000 | 200 | 200 |
| L07:BSAr(sccm) | 2000 | 1 | 1 | 2000 | 2000 | 2000 | 2000 | 2000 | 2000 | 2000 |
| L08:H2(sccm) | 0 | 0 | 0 | 0 | 0 | 0 | 0 | 1700 | 1700 | 1700 |
| L09:B2H6(sccm) | 0 | 1000 | 1000 | 0 | 0 | 0 | 0 | 0 | 0 | 0 |
| L01: WF6 flow mode | chamber | divert | | divert | | divert | chamber | chamber | chamber | |
| L09: B2H6 flow mode | | divert | chamber | | | | | | | |

*L01 to L09 represent the number of a gas line system to a chamber.

MANUFACTURING METHOD OF SEMICONDUCTOR DEVICE

CROSS-REFERENCE TO RELATED APPLICATIONS

The disclosure of Japanese Patent Application No. 2006-282100 filed on Oct. 17, 2006 including the specification, drawings and abstract is incorporated herein by reference in its entirety.

BACKGROUND OF THE INVENTION

The present invention relates to a manufacturing technology of a semiconductor device, in particular, to a technology effective when applied to one of the manufacturing steps of a semiconductor device, that is, filling a metal film, via a barrier metal film, in a connecting hole opened in an insulating film.

In Japanese Patent Laid-Open No. 2004-363402, disclosed is a method of forming a Ti layer on at least the inner wall and bottom portion of a contact hole penetrating an insulating layer, nitriding the Ti layer with N radicals to form a TiN layer on the Ti layer, and filling a conductive layer in the contact hole (refer to Japanese Patent Laid-Open No. 2004-363402, Paragraphs [0026] to [0028], FIGS. 4 and 5).

In Japanese Patent Laid-Open No. 2006-179645, disclosed is a method of forming a contact hole in an interlayer insulating film, forming a Ti film so as to cover the contact hole therewith, subjecting the Ti film to plasma nitriding treatment to form a TiN film on the bottom surface of the contact hole (refer to Japanese Patent Laid-Open No. 2006-179645, Paragraphs [0038] to [0040], FIG. 2).

In Japanese Patent Laid-Open No. 2005-79543, disclosed is a method of forming a Ti film on a substrate by CVD, and successively carrying out oxidation of the surface of the Ti film and nitriding of the surface of the Ti film to form a TiN film (refer to Japanese Patent Laid-Open No. 2005-79543, Paragraphs [0044] to [0048], FIG. 5).

SUMMARY OF THE INVENTION

In semiconductor devices, a semiconductor substrate and an interconnect are connected via a conductive member buried inside of a connecting hole penetrating through an insulating film formed between them, for example, a plug made of tungsten. On the surface of the semiconductor substrate contiguous to the bottom portion of the connecting hole, a silicide layer permitting the formation of a low-resistance and shallow junction is formed. Of silicide layers, a nickel silicide (NiSi) layer has a resistance as low as from 14 to 20 $\mu\Omega\cdot cm$ and can be formed by the silicide technology at a relatively low temperature, for example, at from 400 to 600° C. so that employment of a nickel silicide layer for semiconductor devices which have recently been required to be miniaturized is under investigation.

It is the common practice to form a barrier metal film, which is obtained by depositing a titanium nitride film on a titanium film and thus has a film stack structure, between a plug buried inside of a connecting hole and a nickel silicide layer formed over the surface of a semiconductor substrate. The titanium film is used as a reducing material of the surface of the nickel silicide layer because it can contain, in the solid solution thereof, up to 25 at % of an oxygen atom. This film has a function of reducing a contact resistance with the nickel silicide layer. The titanium nitride film, on the other hand, has a function of suppressing or preventing diffusion of constituent atoms of the plug.

The barrier metal film obtained by depositing a titanium nitride film on a titanium film and thus having a film stack structure has, however, various technological problems as will be described below.

In general, a titanium film is formed by PECVD (Plasma Enhanced Chemical Vapor Deposition) or CVD using a $TiCl_4$ gas and an $H_2$ gas, while a titanium nitride film is formed by CVD using a $TiCl_4$ gas and an $NH_3$ gas. When these films are formed, temperature must be set at 550° C. or less in consideration of the heat resistance of the nickel silicide layer. Formation of the titanium film and titanium nitride film at such a low temperature of 550° C. or less, chlorine, that is, a raw material gas, remains in the barrier metal film of the stack structure of these films and causes an increase in resistance of the barrier metal film. This results in a rise in contact resistance between the plug and nickel silicide layer. In addition to this problem, the barrier metal film has another problem. For example, peeling occurs between the titanium film and titanium nitride film owing to chlorine that has remained in the barrier metal film or microcracks occur in the titanium nitride film when chlorine remaining in the barrier metal film is released to the air.

When a tungsten film, which will be a plug, is filled in the connecting hole, the tungsten film is inevitably deposited on the titanium nitride film constituting the upper portion of the barrier metal film. The tungsten film is formed by CVD while making use of reduction of a $WF_6$ gas with an $H_2$ gas, but fluorine contained in the $WF_6$ gas penetrates the titanium film via a grain boundary of the titanium nitride film and may cause blister or peeling of the titanium film. The titanium nitride film is formed between the titanium film and tungsten film and penetration of fluorine can be prevented by thickening of the titanium nitride film. Resistance of the barrier metal film however increases with the thickening of the titanium nitride film so that the thickness of it must be made as thin as 10 nm or less. Penetration of fluorine contained in the $WF_6$ gas cannot therefore be prevented easily.

The barrier metal film obtained by depositing a titanium nitride film on a titanium film and thus having a film stack structure is formed by successive film formation using a multi-chamber type film forming apparatus because of a good interface condition between the titanium film and titanium nitride film. The formation of the titanium film and titanium nitride film is however accompanied by generation of a relatively large amount of foreign matters compared with the film formation using another semiconductor material. In order to clean the chamber, it is required to terminate the operation of the film forming apparatus whenever the formation of the titanium film or titanium nitride film over 500 semiconductor wafers is finished. It disturbs achievement of a target operation rate. In addition, when either one of a chamber for forming the titanium film or a chamber for forming the titanium nitride film is terminated, the film forming apparatus must be stopped even if the other chamber can be used. Such termination of the chamber causes a further decrease in the operation rate of the film forming apparatus.

One of the objects of the present invention is to provide a technology capable of avoiding an inconvenience at a connection portion obtained by filling, via a barrier metal film composed of a titanium nitride film and a titanium film stacked one after another, a metal film in a connecting hole opened in an insulating film.

Another object of the present invention is to provide a technology capable of improving the operation rate of a multi-chamber type film forming apparatus to be used for the formation of a barrier metal film.

The above-described and another object, and novel features of the present invention will be apparent from the description herein and accompanying drawings.

Of the inventions disclosed by the present application, typical ones will next be outlined briefly.

In one aspect of the present invention, there is thus provided a manufacturing method of a semiconductor device, comprising the steps of forming a titanium film over the bottom portion of a connecting hole opened in an insulating film by a thermal reaction using a $TiCl_4$ gas; forming a titanium film over the titanium film, which has been formed by the thermal reaction, by a plasma reaction using $TiCl_4$ gas; subjecting the surface of the titanium film formed by the plasma reaction to first plasma treatment using an $H_2$ gas and subjecting the surface of the titanium film formed by the plasma reaction to second plasma treatment using an $NH_3$ gas to form a titanium nitride film having a greater nitrogen content than that of its stoichiometric composition; repeatedly carrying out film formation by CVD using a $WF_6$ gas and reduction using a $B_2H_6$ gas multiple times to form a tungsten nucleation film over the titanium nitride film; and forming a tungsten film over the tungsten nucleation film by CVD using a $WF_6$ gas and $H_2$ gas.

In the other aspect of the present invention, there is also provided a manufacturing method of a semiconductor device, comprising the steps of: placing a semiconductor wafer on a wafer stage of a first chamber and dry cleaning the bottom portion of a connecting hole; placing the semiconductor wafer on a wafer stage of a second chamber and heat treating the semiconductor wafer; and placing the semiconductor wafer on a wafer stage of a third chamber, forming a titanium film over the bottom portion of the connecting hole opened in an insulating film by a thermal reaction using a $TiCl_4$ gas, forming a titanium film over the titanium film, which has been formed by the thermal reaction, by a plasma reaction using a $TiCl_4$ gas, subjecting the surface of the titanium film formed by the plasma reaction to first plasma treatment with an $H_2$ gas and subjecting the surface of the titanium film formed by the plasma reaction to second plasma treatment with an $NH_3$ gas to form a titanium nitride film containing more nitrogen than that of its stoichiometric composition.

Advantages available by the typical inventions, of the inventions disclosed by the present application, will next be described briefly.

The present invention makes it possible to avoid an inconvenience at a connection portion obtained by filling, in a connecting hole opened in an insulating film, a tungsten film via a barrier metal film composed of a titanium nitride film and a titanium film stacked one after another. The present invention also makes it possible to improve an operation rate of a multi-chamber type film forming apparatus to be used for the formation of the barrier metal film.

BRIEF DESCRIPTION OF THE DRAWINGS

FIG. 7 is a process step diagram of a first film forming method in the barrier metal film formation step according to Embodiment of the present invention;

FIG. 8 is a process step diagram of a second film forming method in the barrier metal film formation step according to Embodiment of the present invention;

FIG. 9 is a process step diagram of a third film forming method in the barrier metal film formation step according to Embodiment of the present invention;

FIG. 14 is a process step diagram of a film forming method, by thermal CVD, of a titanium nitride film according to Embodiment of the present invention;

FIG. 16 is a process step diagram of a first film forming method in a tungsten film formation step according to Embodiment of the present invention;

FIG. 17 is a process step diagram of a second film forming method in the tungsten film formation step according to Embodiment of the present invention;

FIG. 18 is a process step diagram of a third film forming method in the tungsten film formation step according to Embodiment of the present invention;

DETAILED DESCRIPTION OF THE PREFERRED EMBODIMENTS

Figure 1:
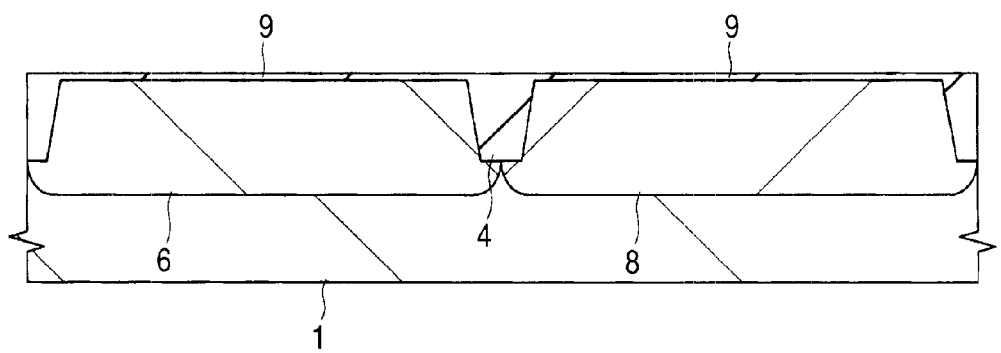
FIG. 1 is a fragmentary cross-sectional view of a semiconductor substrate showing a manufacturing step of a CMOS device according to Embodiment of the present invention.

In the present embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated. And, in the present embodiments, when a reference is made to the number of elements (including the number, value, amount and range), the number is not limited to a specific number but may be greater than or less than the specific number, unless otherwise specifically indicated or principally apparent that the number is limited to the specific number. Further, in the present embodiments, it is needless to say that the constituting elements (including element steps) are not always essential unless otherwise specifically indicated or principally apparent that they are essential. Similarly, in the present embodiments, when a reference is made to the shape or positional relationship of the constituting elements, that substantially analogous or similar to it is also embraced unless otherwise specifically indicated or principally apparent that it is not. This also applies to the above-described value and range.

In the present embodiments, MIS•FET (Metal Insulator Semiconductor Field Effect Transistor) representative of field effect transistors is abbreviated as MIS, p channel MIS•FET is abbreviated as pMIS, and n channel MIS•FET is abbreviated as nMIS. Even if "MOS" is used for the convenience sake, non-oxide films are not excluded. In the present embodiments, the term "wafer" indicates mainly "Si (Silicon) single crystal wafer", but the term "wafer" indicates not only it but also SOI (Silicon On Insulator) wafer or an insulating film substrate for forming an integrated circuit thereover. The shape of the wafer is not limited to disc or substantially disc, but also square and rectangular wafers are embraced. It is needless to say that the term "silicon film", "silicon portion", "silicon member" or the like means not only a film, portion or member composed of pure silicon but also that containing impurities, an alloy having silicon as a main component such as SiGe or SiGeC (including strained silicon), and that containing additives unless otherwise clearly apparent that it is not or specifically indicated that it is not. It is needless to say that the term "polycrystalline silicon" embraces not only a typical one but also amorphous silicon or the like unless otherwise clearly apparent that it is not or specifically indicated that it is not.

In all the drawings for describing the embodiments, members of a like function will be identified by like reference numerals and overlapping descriptions will be omitted as much as possible. Embodiments of the invention will hereinafter be explained in detail based on accompanying drawings.

The dry cleaning technology is disclosed in Japanese Patent Application No. 2006-30704 (filed on Jan. 11, 2006) by Ichinose, et al., Japanese Patent Application No. 2006-12355 (filed on Jan. 20, 2006) by Ichinose, et al., Japanese Patent Application No. 2006-107780 (filed on Apr. 10, 2006) by Futase, et al., or Japanese Patent Application No. 2006-138949 (filed on May 18, 2006) by Futase, et al. so that overlapping descriptions will not be included herein in principle.

Figure 15:
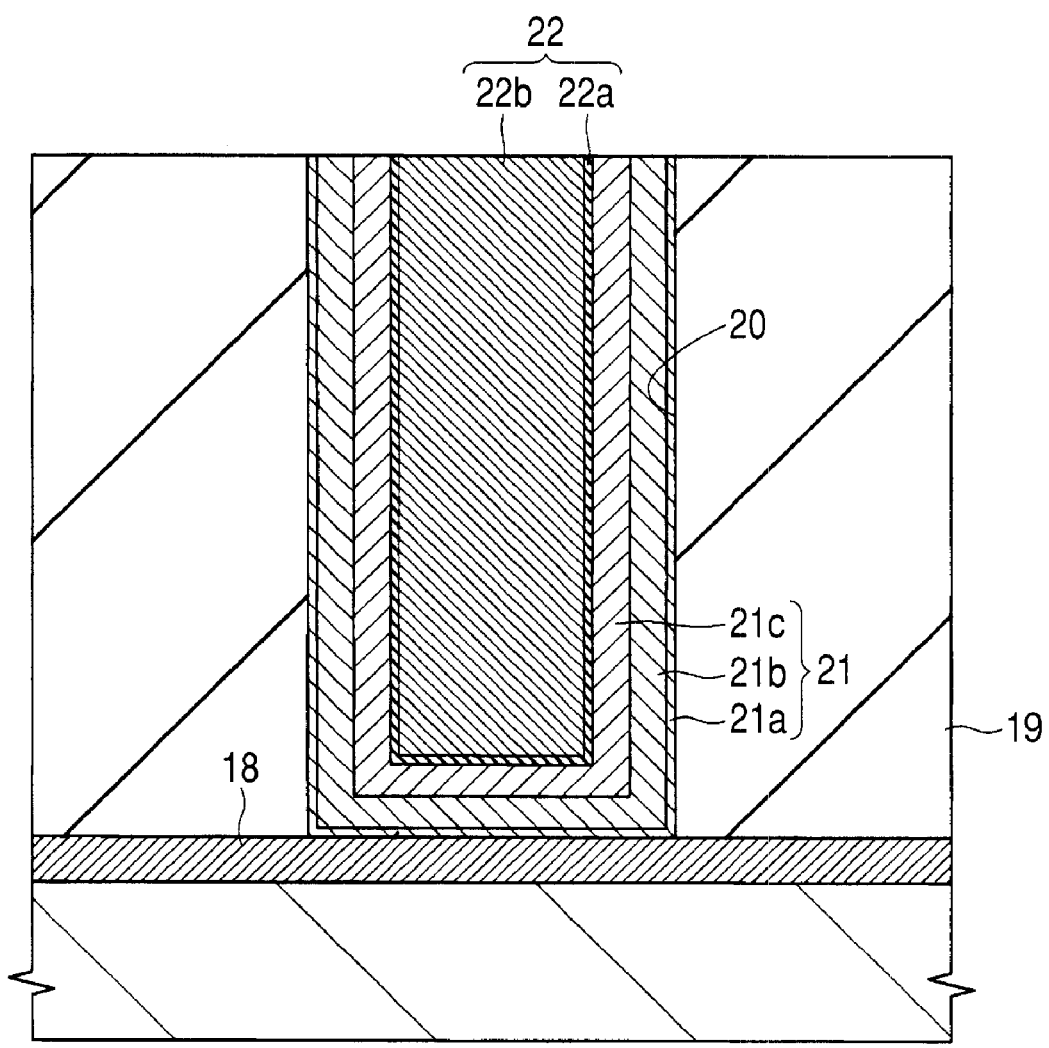
FIG. 15 is a fragmentary enlarged cross-sectional view of the inside of the connecting hole during a manufacturing step of the CMOS device following that of FIG. 10, 11, 12 or 13.

A manufacturing method of a COMS (Complementary Metal Oxide Semiconductor) device according to Embodiment of the present invention will be described based on FIGS. 1 to 22. FIGS. 1 to 5 are fragmentary cross-sectional views of the CMOS device; FIG. 6 is a schematic plan view of a barrier metal film forming apparatus; FIGS. 7 to 9 are diagrams showing a process step of the barrier metal film formation; FIGS. 10 to 13 are fragmentary enlarged cross-sectional views of the barrier metal film and plug in a connecting hole; FIG. 14 is a diagram showing the process step of the barrier metal film formation; FIG. 15 is a fragmentary enlarged cross-sectional view showing the inside of the connecting hole 15; FIGS. 16 to 18 are diagrams showing the process step of tungsten film formation; and FIGS. 19 to 22 are fragmentary cross-sectional view of the CMOS device.

As illustrated in FIG. 1, a semiconductor substrate (thin semiconductor plate having a substantially flat disk shape, which is called "semiconductor wafer") 1 made of, for example, p type single crystal silicon is prepared. An element isolation region 4 is then formed in the main surface of the semiconductor substrate 1. The element isolation region 4 is formed by etching the semiconductor substrate 1 to form a trench having a depth of 0.35 μm, depositing an insulating film, for example, a silicon oxide film, over the main surface of the semiconductor substrate 1 by CVD and then removing the silicon oxide film by CMP (Chemical Mechanical Polishing) from the outside of the trench.

A p type impurity such as boron is ion-implanted into the nMIS formation region of the semiconductor substrate 1 to form a p well 6, while an n type impurity such as phosphorus is ion-implanted into the pMIS formation region of the semiconductor substrate 1 to form an n well 8. An impurity may be ion-implanted into the p well 6 or n well 8 in order to control the threshold value of the nMIS or pMIS.

After washing the surface of the semiconductor substrate 1 by wet etching with, for example, an aqueous solution of hydrofluoric acid, the semiconductor substrate 1 is thermally oxidized to form a gate insulating film 9 of, for example, 5 nm thick on the surface (the respective surfaces of the p well 6 and n well 8) of the semiconductor substrate 1.

Figure 2:
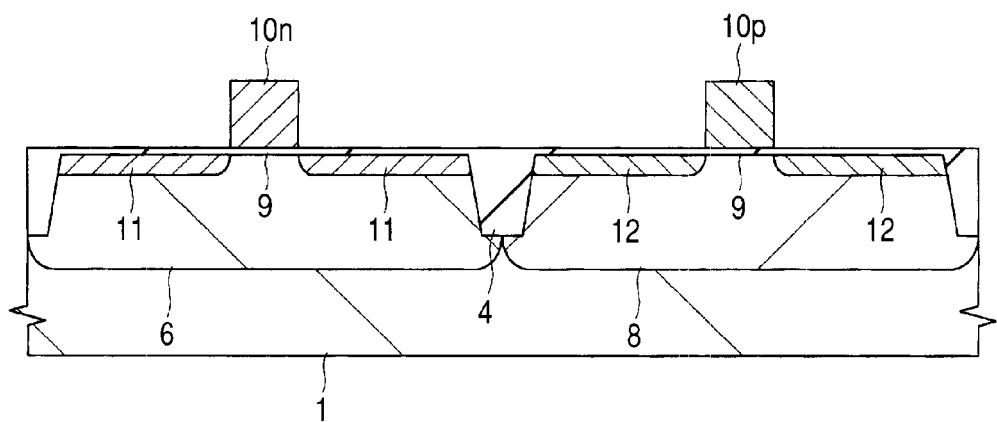
FIG. 2 is a fragmentary cross-sectional view of the same portion in FIG. 1 during a manufacturing step of the CMOS device following that of FIG. 1.

As illustrated in FIG. 2, after formation of a conductor film of, for example, 0.14 μm thick for gate electrode on the gate insulating film 9, gate electrodes 10$n$ and 10$p$ made of the conductor film are formed by dry etching the conductor film for gate electrode with a resist pattern as a mask. The conductor film for gate electrode is made of a polycrystalline silicon film formed, for example, by CVD. In the nMIS formation region, the gate electrode 10$n$ made of a polycrystalline silicon film having an n type impurity introduced therein is formed, while in the pMIS formation region, the gate electrode 10$p$ made of a polycrystalline silicon film having a p type impurity introduced therein is formed.

An n type impurity, for example, arsenic is then ion-implanted into the p well 6 to form relatively lightly doped source•drain extension regions 11 in self alignment with the gate electrode 10$n$ of the nMIS. Similarly, a p type impurity, for example, boron fluoride is ion-implanted into the n well 8 to form relatively lightly doped source-drain extension regions 12 in self alignment with the gate electrode 10$p$ of the pMIS. The source•drain extension regions 11 and 12 each has a depth of, for example, 30 nm.

Figure 3:
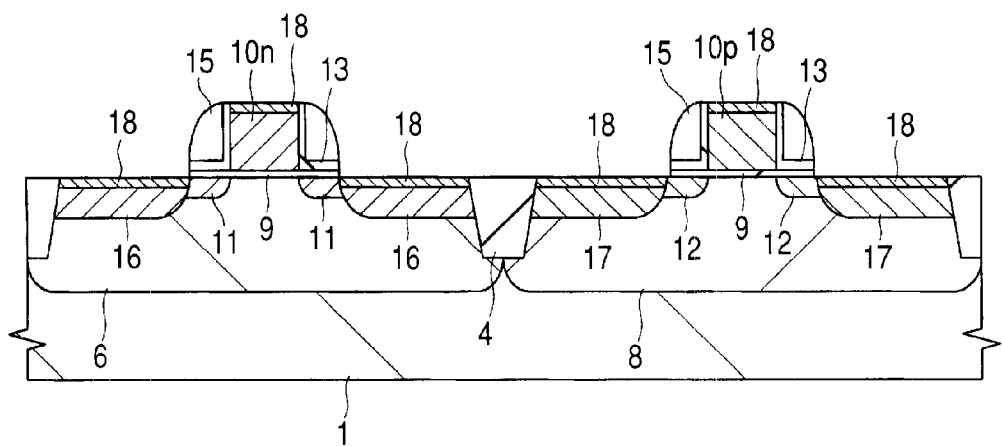
FIG. 3 is a fragmentary cross-sectional view of the same portion in FIG. 1 during a manufacturing step of the CMOS device following that of FIG. 2.

As illustrated in FIG. 3, after deposition of a silicon oxide film 13 of, for example, 10 nm thick over the main surface of the semiconductor substrate 1 by CVD, a silicon nitride film is deposited by CVD over the silicon oxide film 13. The silicon nitride film is then anisotropically etched by RIE (Reactive Ion Etching) to form sidewalls 15 over the side walls of the gate electrode 10$n$ of the nMIS and gate electrode 10$p$ of the pMIS. An n type impurity, for example, arsenic is then ion-implanted into the p well 6 to form a relatively heavily doped source•drain extension regions 16 in self alignment with the gate electrode 10$n$ and sidewalls 15 of the nMIS. Similarly, a p type impurity, for example, boron fluoride is ion-implanted into the n well 8 to form a relatively heavily doped source•drain extension regions 17 in self alignment with the gate electrode 10$p$ and sidewalls 15 of the pMIS. The source•drain extension regions 16 and 17 each has a depth, for example, 80 nm.

A low-resistance nickel silicide (NiSi) layer 18 is then formed over the surfaces of the gate electrode 10$n$ and source•drain extension regions 16 of the nMIS and the surfaces of the gate electrode 10$p$ and source•drain extension regions 17 of the pMIS by the salicide technology. Instead of the nickel silicide layer 18 shown in this Embodiment, another silicide layer such as nickel alloy silicide layer, cobalt silicide layer, tungsten silicide layer or platinum silicide layer may be formed. The nickel silicide layer 18 is formed, for example, by the method described below.

First, a nickel film and a titanium nitride film are deposited successively over the main surface of the semiconductor substrate 1 by sputtering. The nickel film has a thickness of, for example, 10 nm, while that of the titanium nitride film has a thickness of, for example, 15 nm. The titanium nitride film is formed over the nickel film in order to prevent oxidation of the nickel film and it may be replaced by a titanium film. A nickel silicide layer 18 is then formed over the semiconductor substrate 1 by RTA (Rapid Thermal Anneal), for example, heat treatment at 350° C. for 30 seconds to selectively react the nickel film with the n type polycrystalline silicon film constituting the gate electrode 10$n$ of the nMIS and the nickel film with the single crystal silicon constituting the semiconductor substrate 1 in which the source•drain extension regions 16 of the nMIS have been formed. At the same time, a nickel silicide layer 18 is formed by selectively reacting the nickel film with the p type polycrystalline silicon film constituting the gate electrode 10$p$ of the pMIS and the nickel film with the single crystal silicon constituting the semiconductor substrate 1 in which the source•drain extension regions 17 of the pMIS have been formed. After removal of the unreacted nickel film and titanium nitride film by wet cleaning with sulfuric acid or wet cleaning with sulfuric acid and aqueous hydrogen peroxide, the resistance of the nickel silicide layer 18 is decreased by subjecting the semiconductor substrate 1 to RTA, for example, heat treatment at 550° C. for 30 seconds.

Figure 4:
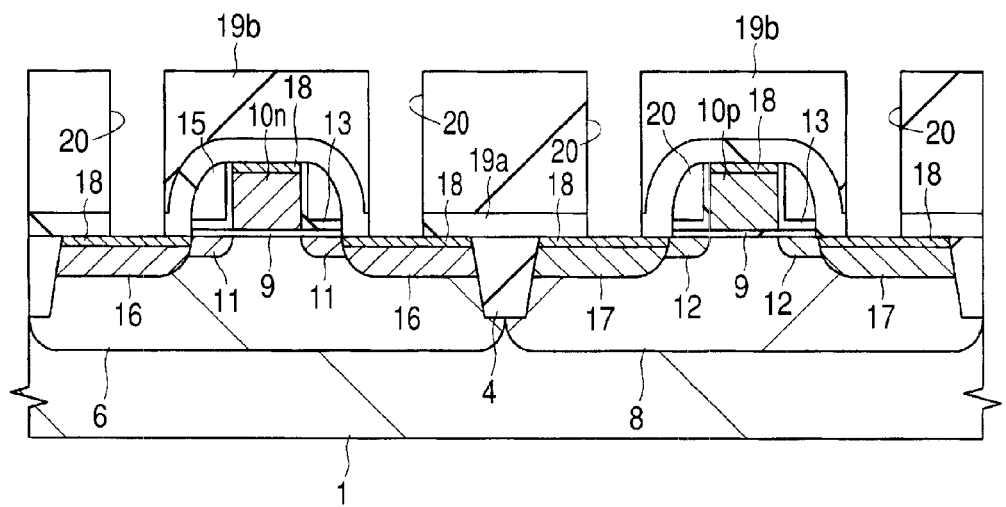
FIG. 4 is a fragmentary cross-sectional view of the same portion in FIG. 1 during a manufacturing step of the CMOS device following that of FIG. 3.

As illustrated in FIG. 4, a silicon nitride film is deposited over the main surface of the semiconductor substrate 1 by CVD to form a first insulating film 19$a$. A TEOS (Tetra Ethyl Ortho Silicate) film is deposited over the first insulating film 19$a$ by plasma CVD to form a second insulating film 19$b$, whereby an interlayer insulating film made of the first and second insulating films 19$a$ and 19$b$ is formed. The surface of the second insulating film 19$b$ is then polished by CMP. Even if the first insulating film 19$a$ has irregularities on the surface thereof attributable to the step difference of the underlying film, an interlayer insulating film having a planarized surface is available by polishing the surface of the second insulating film 19$b$ by CMP.

With a resist pattern as a mask, the first and second insulating films 19$a$ and 19$b$ are etched to form a connecting hole 20 at predetermined positions, for example, the first and second insulating films 19$a$ and 19$b$ above the gate electrode 10$n$ and source-drain extension regions 16 of the nMIS and gate electrode 10$p$ and source-drain extension regions 17 of the pMIS. The connecting hole 20 has a diameter of 0.1 μm or less, for example, 0.08 μm.

Figure 5:
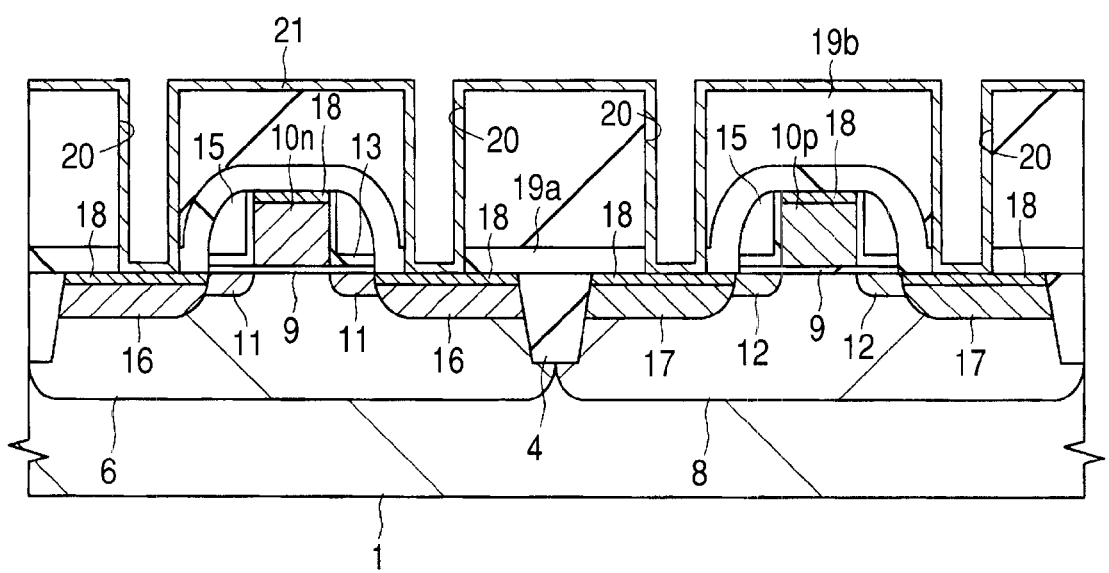
FIG. 5 is a fragmentary cross-sectional view of the same portion in FIG. 1 during a manufacturing step of the CMOS device following that of FIG. 4.
Figure 6:
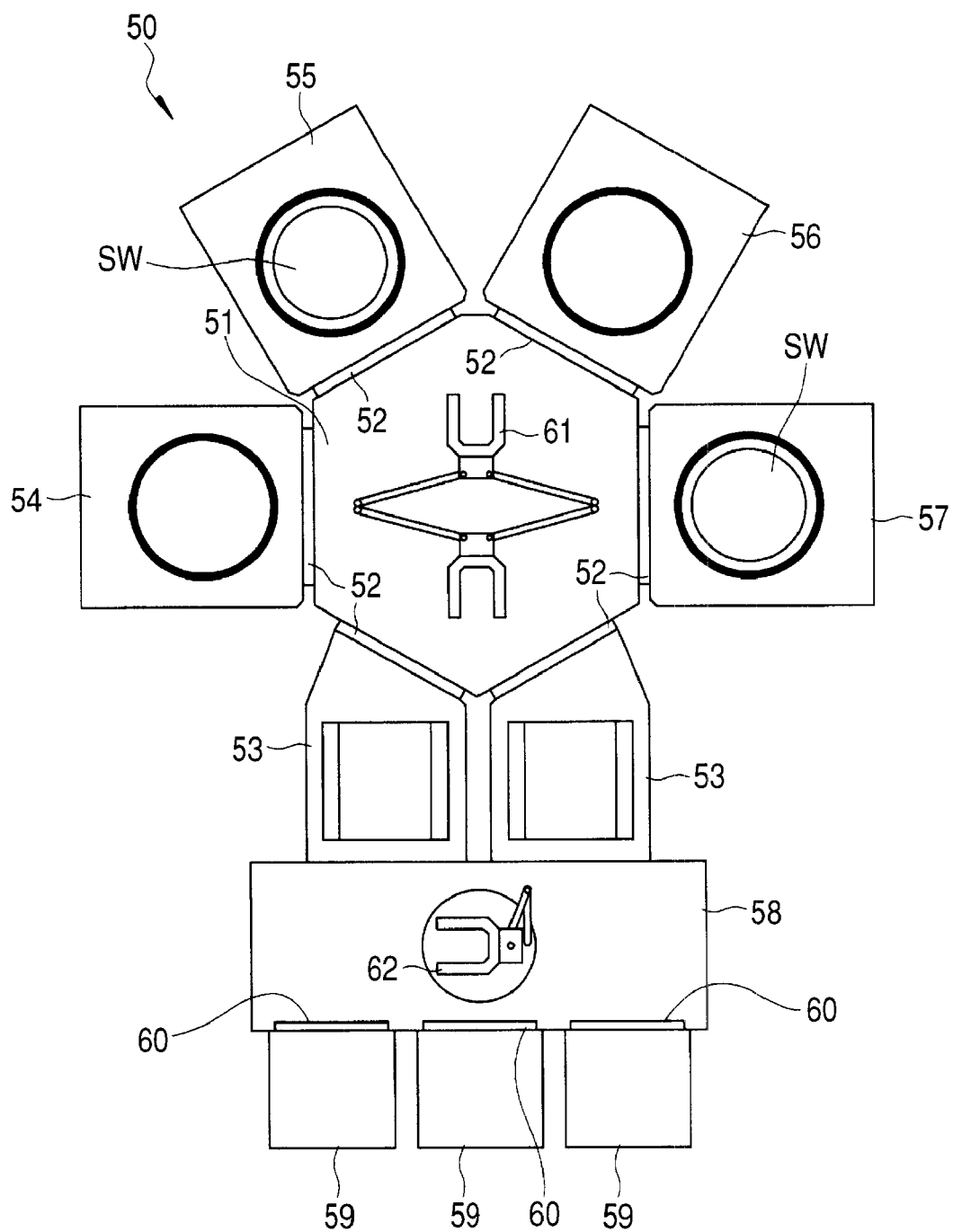
FIG. 6 is a schematic plan view of a film forming apparatus for a barrier metal film according to Embodiment of the present invention.

As illustrated in FIG. 5, a titanium film and a titanium nitride film are formed successively over the main surface of the semiconductor substrate 1 including the inside of the connecting holes 20 to form a barrier metal film 21 made of this film stack. The titanium film can contain, in the solid solution thereof, up to 25 at % of an oxygen atom so that it is used as a reducing material of the surface of the nickel silicide layer 18 and has a function of decreasing the contact resistance with the nickel silicide layer 18. The titanium nitride film has a function of suppressing or preventing diffusion of atoms constituting a metal film to be filled in the connecting hole 20 in a later step. The barrier metal film 21 has a thickness of, for example, from 3 to 10 nm. In the following description, the titanium film and titanium nitride film formed thereover are called barrier metal film 21 and they are distinguished from a metal film, for example, a tungsten film which will be filled in the connecting hole 20 and serve as a main conductive material.

For the formation of the barrier metal film 21, a film forming apparatus 50 illustrated in FIG. 6 is employed. The film forming apparatus 50 is a multi-chamber type apparatus equipped with a transfer chamber 51 and, around it via gate valves 52 serving as a switching means, a loadlock chamber 53 and four chambers 54, 55, 56 and 57. The apparatus has, on the side of the loadlock chamber 53 opposite to the transfer chamber 51, a wafer carrying in-and-out chamber 58. On the side of the carrying in-and-out chamber 58 opposite to the loadlock chamber 53, the apparatus has a port 60 for attaching a FOUP (Front Open Unified Pod) 59 in which semiconductor wafers SW are housed.

The transfer chamber 51 is maintained at a predetermined degree of vacuum by an exhaust mechanism or the like and it has, on the center thereof, a transfer robot 61 having a multijoint arm structure for transferring semiconductor wafers SW.

The transfer chamber 51 has a chamber (first chamber) 54 for dry cleaning treatment, a chamber (second chamber) 55 for heat treatment at high temperatures, for example, 150° C. or greater, and chambers (third chambers) 56 and 57 for the formation of a barrier metal film. It is to be noted that chambers of the transfer chamber 51 of this film forming apparatus 50 is not limited to these four chambers, but a chamber having the same using purpose or a chamber having another using purpose can be added.

First, a single semiconductor wafer SW is taken out from any one of the FOUPs 59 by a transfer robot 62 placed in the wafer carrying in-and-out chamber 58 and transferred to either one of the loadlock chambers 53. The FOUP 59 is a hermetically sealed container for batch transfer of semiconductor wafers SW and usually stores therein a batch of 25, 12 or 6 semiconductor wafers. The outside wall of the container of the FOUP 59 has an air tight structure except for a minute ventilation filter portion and dusts are excluded from the FOUP substantially completely. Accordingly, even when they are transferred in an atmosphere of cleanliness class 1000, the inside of the container can be kept at cleanliness class 1. Docking with the film forming apparatus 50 is conducted while keeping the cleanliness by drawing the door of the FOUP 59, which has been attached to the port 60, to the inward side of the wafer carrying in-and-out chamber 58. After the loadlock chamber 53 is vacuumed, the semiconductor wafer SW is carried in the transfer chamber 51 by the aid of the transfer robot 61.

The semiconductor wafer SW is then vacuum-transferred from the transfer chamber 51 to the dry cleaning transfer chamber 54 by the aid of the transfer robot 61 and placed on a wafer stage of the chamber 54. The wafer stage of the chamber 54 is equipped with a mechanism of holding the wafer by the electrostatic adsorption, whereby the temperature of the wafer can be controlled efficiently. During dry cleaning treatment, a reducing gas (seventh reaction gas) such as an Ar gas added with an HF gas and $NH_3$ gas is introduced into the chamber 54 and supplied onto the main surface of the semiconductor wafer SW via a shower head. By the reduction reaction, for example, represented by the formula (1) that occurs between the reducing gas and a natural oxide film formed over the surface of the nickel silicide layer 18, the natural oxide film is removed. The dry cleaning treatment are performed, for example, under the following conditions:

wafer stage temperature of 25° C., HF gas flow rate of 80 sccm, NH₃ gas flow rate of 38 sccm, Ar gas flow rate of 5 sccm, and pressure of 1.3 Pa.

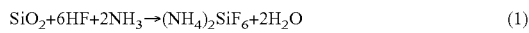

$$SiO_2 + 6HF + 2NH_3 \rightarrow (NH_4)_2SiF_6 + 2H_2O \qquad (1)$$

A product ($(NH_4)_2SiF_6$) formed by the above-described reduction reaction remains over the main surface of the semiconductor wafer SW including the inside of the connecting hole 20.

The semiconductor wafer SW is then vacuum-transferred from the dry cleaning chamber 54 to the heat treatment chamber 55 via the transfer chamber 51 by the aid of the transfer robot 61 and is then placed on a stage of the chamber 55. By placing the semiconductor wafer SW on the stage of the chamber 55, the semiconductor wafer SW is heated at a predetermined temperature and the product which has remained on the main surface of the wafer SW is removed by sublimation. As the temperature on the main surface of the semiconductor wafer SW, a range of from 150 to 400° C. may be adequate (it is needless to say that the temperature is not limited to this range and varies, depending on conditions). A temperature range suited for mass production may be from 165 to 350° C., but a range of from 180 to 220° C. with 200° C. as a center value is most suited.

The barrier metal film 21 is then formed. Since the product formed over the bottom and side surfaces of the connecting hole 20 during the dry cleaning treatment has already been removed by the heat treatment of the semiconductor substrate 1 at from 150 to 400° C. conducted after the dry cleaning treatment, variations in the contact resistance between the barrier metal film 21 and nickel silicide layer 18 on the bottom surface of the connecting hole 20 can be decreased. In addition, peeling of the barrier metal film 21 on the side surface of the connecting hole 20 can be prevented.

In the above dry cleaning treatment, an HF gas and NH₃ gas are employed as a reducing gas. No particular limitation is however imposed on the reaction gas such as reducing gas insofar as it forms a reactive species that vaporizes as a result of reaction with an oxide film at a relatively low temperature. For example, an NF₃ gas and H₂ gas may be used as the reducing gas.

In the above dry cleaning treatment, a reaction gas such as reducing gas is introduced into the chamber 54 to remove the natural oxide film by a reduction reaction. Instead of a gas, plasma is usable. For example, plasma is formed by excitation of an Ar gas (Ar gas is used frequently as a gas for plasma excitation, but another dilute gas or mixture thereof is also usable) added with a reducing gas, for example, an NF₃ gas or NH₃ gas, and the resulting plasma is introduced into the chamber 54 to remove the natural oxide film by a reduction reaction.

The semiconductor wafer SW is then vacuum-transferred from the heat treatment chamber 55 to the barrier metal film forming chamber 56 or chamber 57 via the transfer chamber 51 by the aid of the transfer robot 61 and placed on a stage of the chamber 56 or 57.

The film forming apparatus 50 is equipped with two barrier metal film forming chambers 56 and 57 having the same function and same structure. Since one film forming apparatus 50 has two chambers 56 and 57 equal in function and structure, the barrier metal film 21 can be formed without stopping the film forming apparatus 50 by using, even if one of the chambers, for example, the chamber 56 comes to stop, the other chamber, for example, chamber 57. This leads to improvement in the operation rate of the film forming apparatus 50.

In the chamber 56 (or chamber 57), the barrier metal film 21 is formed over the main surface of the semiconductor wafer SW by PECVD which will be described later. The first to fourth film forming methods of the barrier metal film 21 will next be described herein. It is however to be noted that the method of forming the barrier metal film 21 is not limited thereto but various modifications of them can be employed.

Figure 10:
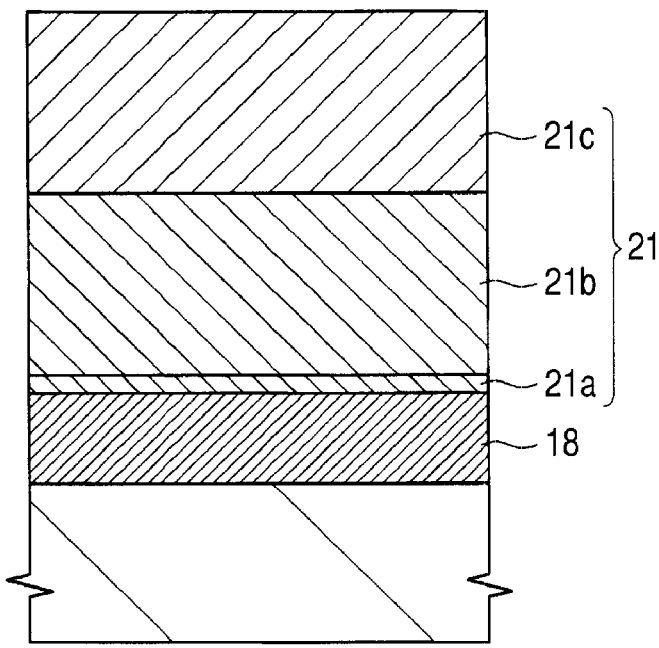
FIG. 10 is a fragmentary enlarged cross-sectional view illustrating a barrier metal film and a plug in a connecting hole during a manufacturing step of the CMOS device following that of FIG. 5.

The first film forming method of the barrier metal film 21 will next be described with reference to FIGS. 7 and 10.

[Step 1] A semiconductor wafer SW is placed on a stage heated by a heater to a predetermined temperature, for example, 450° C. During from Step 1 to Step 10, the stage is constantly heated to a predetermined temperature, for example, 450° C. An Ar gas and H₂ gas are introduced by an exhaust mechanism into the chamber to adjust the pressure therein to a predetermined pressure, for example, 667 Pa within a time predetermined in Step 1, for example, 5 seconds. The flow rate of the Ar gas is, for example, 800 sccm, while that of the H₂ gas is, for example, 4000 sccm. [Step 2] After adjustment of the pressure and the flow rates of the Ar gas and H₂ gas to predetermined values, the wafer is heated for a predetermined time. During from Step 2 to Step 9, the pressure in the chamber is maintained at a predetermined one (for example, 667 Pa) and during from Step 2 to Step 10, the Ar gas and H₂ gas are introduced constantly into the chamber at predetermined flow rates (for example, 800 sccm and 4000 sccm, respectively). [Step 3] A TiCl₄ gas (first reaction gas) is supplied from a supply source of a TiCl₄ gas but it is diverted just upstream of the chamber until the flow rate becomes stable. The flow rate of the TiCl₄ gas is, for example, 6.7 sccm. [Step 4] After the flow rate of the TiCl₄ gas becomes stable, the TiCl₄ gas is introduced into the chamber to selectively form a titanium film (which will hereinafter be called "thermal reaction Ti film"; first metal film) 21a over the surface of the nickel silicide layer 18 by the thermal reaction. The flow rate of the TiCl₄ gas is, for example, 6.7 sccm and the heat treatment time is, for example, from 5 to 30 seconds. The thermal reaction Ti film 21a has a thickness of for example 1 nm or less. The thermal reaction Ti film 21a is formed only on the surface of the nickel silicide layer 18 exposed from the bottom portion of the connecting hole 20 and is not formed over the side wall of the connecting hole 20 and upper surface of the second insulating film 19b. [Step 5] By generating plasma in the chamber by the application of a high-frequency power, a titanium film (which will hereinafter be called "plasma reaction Ti film"; second metal film) 21b is formed over the thermal reaction Ti film 21a. The flow rate of the TiCl₄ gas is, for example, 6.7 sccm, the high-frequency power is, for example, 800 W and film formation time is, for example, 25 seconds. The thickness of the plasma reaction Ti film 21b is 2 nm or greater, for example, from 3 to 10 nm. [Step 6] Plasma treatment (first plasma treatment) of the plasma reaction Ti film 21b is performed using an H₂ gas (second reaction gas) while stopping only the introduction of the TiCl₄ gas into the chamber and a chlorine concentration of the plasma reaction Ti film 21b is reduced. The plasma treatment time is, for example, 5 seconds.

[Step 7] Application of a high frequency voltage is terminated and the TiCl₄ gas is discharged from the chamber. [Step 8] An NH₃ gas (third reaction gas) is introduced into the chamber and the surface of the plasma reaction Ti film 21b is nitrided by a thermal reaction. The flow rate of the NH₃ gas is, for example, 500 sccm and the heat treatment time is, for example, 10 seconds. [Step 9] A high-frequency power is applied to generate plasma (second plasma treatment) and a titanium nitride film (which will hereinafter be called "nitrogen-rich TiN film"; first metal nitride film) 21c containing a little more nitrogen than that of its stoichiometric composition, for example, a $Ti_1N_{1.1}$ film is formed over the surface of the plasma reaction Ti film 21b. A high frequency voltage is, for example, 800 W and nitriding time is, for example, 25 seconds. [Step 10] After application of a high frequency voltage is stopped and introduction of the $NH_3$ gas into the chamber is stopped, the $NH_3$ gas is discharged from the chamber.

By the first film forming method, the barrier metal film 21 composed of the thermal reaction Ti film 21a, plasma reaction Ti film 21b and nitrogen-rich TiN film is formed. The thermal reaction Ti film 21a has a thickness of, for example, 1 nm or less, the plasma reaction Ti film 21b has a thickness of, for example, 5 nm, and the nitrogen-rich TiN film 21c has a thickness of, for example, from 3 to 5 nm.

The contact resistance of the thermal reaction Ti film 21a with the nickel silicide layer 18 can be made low. This low contact resistance is presumed to result from (1) the formation of $(Ni_1Ti_{1-x})Si$ on the interface between the nickel silicide layer 18 and thermal reaction Ti film 21a, (2) a smaller impurity concentration in the thermal reaction Ti film 21a than that in the plasma reaction Ti film 21b because pure titanium is formed by the thermal decomposition reaction using nickel silicide as a catalyst, and (3) reduction of titanium chloride by an ultratrace amount of fluorine remaining after the dry cleaning treatment. The nitrogen-rich TiN film 21c is effective as a barrier film for suppressing or preventing diffusion of constituent atoms of the plug. Moreover, the concentration of an impurity, such as chlorine, contained in the plasma reaction Ti film 21b decreases by the plasma treatment in Step 6.

Figure 11:
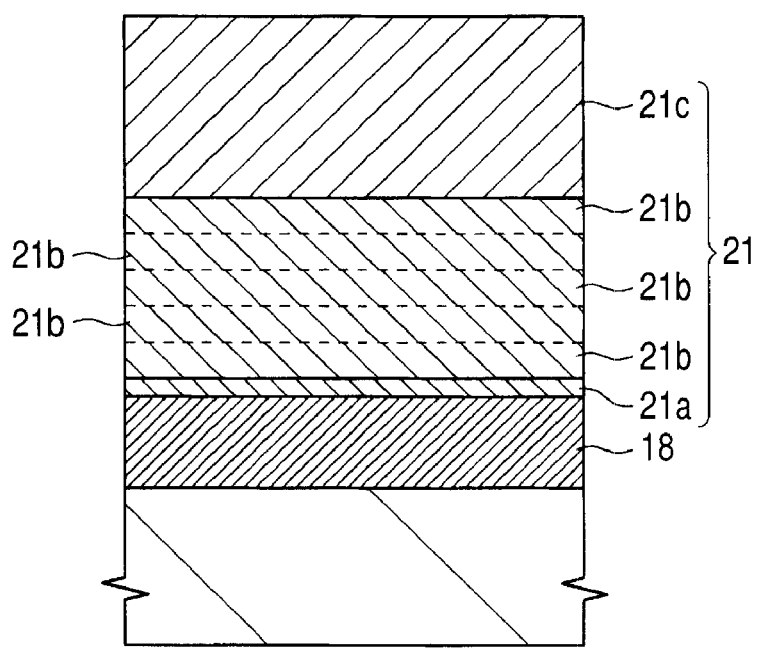
FIG. 11 is a fragmentary enlarged cross-sectional view of the same portion in FIG. 10 during a manufacturing step of the CMOS device following that of FIG. 5.

The second film forming method of the barrier metal film 21 will next be described with reference to FIGS. 8 and 11.

The second film forming method is similar in steps from [Step 1] to [Step 6] to the first film forming method so that description on them is omitted. It is however to be noted that the film formation time of the plasma reaction Ti film 21b in Step 5 is, for example, 5 seconds.

[Step 7] A $TiCl_4$ gas is supplied from a supply source of a $TiCl_4$ gas and it is diverted just upstream of the chamber until the flow rate becomes stable. The flow rate of the $TiCl_4$ gas is, for example, 6.7 sccm. [Step 8] After the flow rate of the $TiCl_4$ gas becomes stable, another plasma reaction Ti film 21b is formed over the plasma reaction Ti film 21b by introducing the $TiCl_4$ gas into the chamber and applying a high frequency power. The flow rate of the $TiCl_4$ gas is, for example, 6.7 sccm, the high frequency power is, for example 800 W, and the film formation time is, for example, 5 seconds. The another plasma reaction Ti film 21b has a thickness of, for example, from 1 to 2 nm. [Step 9] A chlorine concentration of the plasma reaction Ti film 21b is reduced by stopping only the introduction of the $TiCl_4$ gas into the chamber and carrying out plasma treatment of the plasma reaction Ti film 21b with an $H_2$ gas. The plasma treatment time is, for example, 5 seconds. Steps from [Step 7] to [Step 9] are carried out multiple times, for example, four times. The total thickness of the plasma reaction Ti film 21b becomes, for example, from 5 to 10 nm.

[Step 10] The application of the high frequency voltage is terminated and the $TiCl_4$ gas is discharged from the chamber. [Step 11] An $NH_3$ gas is introduced into the chamber and the surface of the plasma reaction Ti film 21b is nitrided by a thermal reaction. The flow rate of the $NH_3$ gas is, for example, 500 sccm and heat treatment time is, for example, 10 seconds. [Step 12] A nitrogen-rich TiN film 21c is then formed over the surface of the plasma reaction Ti film 21b by applying a high frequency power to generate plasma. The high frequency power is, for example, 800 W and nitriding treatment time is, for example, 25 seconds. [Step 13] After application of a high frequency voltage is stopped and introduction of the $NH_3$ gas is also stopped, the $NH_3$ gas is discharged from the chamber.

By the second film forming method, the barrier metal film 21 composed of the thermal reaction Ti film 21a, (multistage) plasma reaction Ti film 21b, and nitrogen-rich TiN film 21c is formed. The thermal reaction Ti film 21a has a thickness of, for example, 1 nm or less, the plasma reaction Ti film 21b has a thickness of, for example, 5 nm, and the nitrogen-rich TiN film 21c has a thickness of for example, from 3 to 5 nm.

As in the first film forming method, the contact resistance of the thermal reaction Ti film 21a with the nickel silicide layer 18 can be made low and the nitrogen-rich TiN film 21c is effective as a barrier film for suppressing or preventing diffusion of constituent atoms of the plug. Moreover, in the process composed of Steps 5 and 6+(Steps 7, 8 and 9)×4, the formation of the plasma reaction Ti film 21b and reduction can be carried out alternately in a relatively short time so that the concentration of an impurity such as chlorine not only on the surface of the plasma reaction Ti film 21b but also therein can be reduced, making it possible to obtain the plasma reaction Ti film 21b having a low specific resistance and therefore having good quality.

Figure 12:
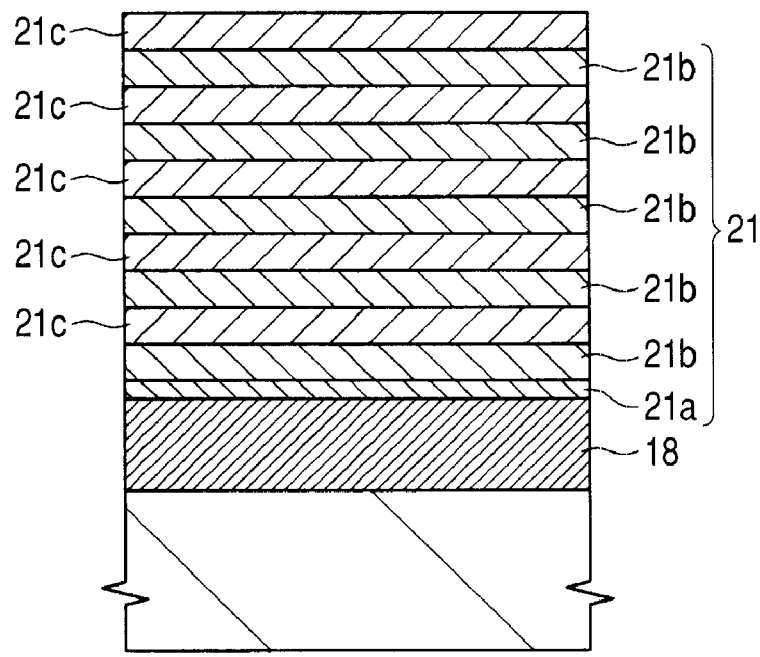
FIG. 12 is a fragmentary enlarged cross-sectional view of the same portion in FIG. 10 during a manufacturing step of the CMOS device following that of FIG. 5.

The third film forming method of the barrier metal film 21 will next be described with reference to FIGS. 9 and 12.

The third film forming method is similar in steps from [Step 1] to [Step 10] to the first film forming method so that description on them is omitted. It is however to be noted that the film formation time of the plasma reaction Ti film 21b in Step 5 is, for example, 5 seconds and the nitriding heat treatment time in Step 8 is, for example, 5 seconds.

[Step 11] A $TiCl_4$ gas is supplied from a supply source of a $TiCl_4$ gas and it is diverted just upstream of the chamber until the flow rate becomes stable. The flow rate of the $TiCl_4$ gas is, for example, 6.7 sccm. [Step 12] After the flow rate of the $TiCl_4$ gas becomes stable, a plasma reaction Ti film 21b is formed over the nitrogen-rich TiN film 21c by introducing the $TiCl_4$ gas into the chamber and applying a high frequency voltage to generate plasma. The flow rate of the $TiCl_4$ gas is, for example, 6.7 sccm, the high frequency power is, for example 800 W, and the film formation time is, for example, 5 seconds. The plasma reaction Ti film 21b has a thickness of, for example, from 1 to 2 nm. [Step 13] A chlorine concentration of the plasma reaction Ti film 21b is decreased by stopping only the introduction of the $TiCl_4$ gas into the chamber and carrying out plasma treatment of the plasma reaction Ti film 21b with an $H_2$ gas. The plasma treatment time is, for example, 5 seconds. [Step 14] The application of a high frequency voltage is stopped and the $TiCl_4$ gas is discharged from the chamber. [Step 15] An $NH_3$ gas is introduced into the chamber and the surface of the plasma reaction Ti film 21b is nitrided by a thermal reaction. The flow rate of the $NH_3$ gas is, for example, 500 sccm and heat treatment time is, for example, 10 seconds. [Step 16] A nitrogen-rich TiN film 21c is formed over the surface of the plasma reaction Ti film 21b by applying a high frequency power to generate plasma. The high frequency power is, for example, 800 W and nitriding time is, for example, 5 seconds. [Step 17] After application of a high frequency voltage is stopped and introduction of an $NH_3$ gas into the chamber is stopped, an $NH_3$ gas is discharged from the chamber. Steps from [Step 11] to [Step 17] are performed multiple times, for example, four times.

A barrier metal film 21 composed of the thermal reaction Ti film 21a and (plasma reaction Ti film 21b and nitrogen-rich TiN film 21c)×5 is formed by the third film forming method. The thermal reaction Ti film 21a has a thickness of, for example, 1 nm or less and the (plasma reaction Ti film 21b+ nitrogen-rich TiN film 21c)×5 has a thickness of from 5 to 10 nm.

As in the first film forming method, the contact resistance of the thermal reaction Ti film 21a with the nickel silicide layer 18 can be made low and the nitrogen-rich TiN film 21c is effective as a barrier film for suppressing or preventing diffusion of constituent atoms of the plug. Moreover, in the process composed of Steps 5, 6, 7, 8, 9 and 10+(Steps 11, 12, 13, 14, 15, 16 and 17)×4, by carrying out a series of procedures, that is, formation of the plasma reaction Ti film 21b, reduction and nitriding multiple times in a relatively short time, the concentration of an impurity such as chlorine can be reduced and therefore, the plasma reaction Ti film 21b having a low specific resistance and therefore having good quality can be obtained. At the same time, the nitrogen-rich TiN film 21c capable of effectively functioning as a barrier film can be formed over the surface of the plasma reaction Ti film 21b.

Figure 13:
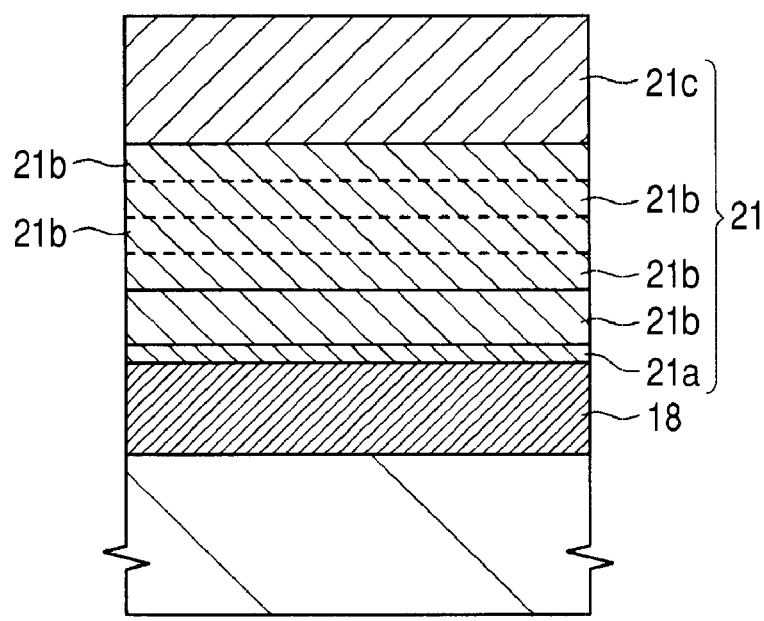
FIG. 13 is a fragmentary enlarged cross-sectional view of the same portion in FIG. 10 during a manufacturing step of the CMOS device following that of FIG. 5.

The fourth film forming method of the barrier metal film 21 will next be described with reference to FIGS. 8 and 13.

The fourth film forming method is similar in steps from [Step 1] to [Step 6] to the second film forming method so that a description on them is omitted. The fourth film forming method is however different from the second film forming method in that the film formation time of the plasma reaction Ti film 21b in Step 5 is, for example, from 5 seconds to 15 seconds and the first-stage plasma reaction Ti film 21b is thicker than the first-stage plasma reaction Ti film 21b formed by the second film forming method. Steps of the fourth film forming method from [Step 7] to [Step 13] are similar to those of the second film forming method so that a description on them is also omitted.

A barrier metal film 21 composed of the thermal reaction Ti film 21a, plasma reaction Ti film 21b, (multistage) plasma reaction Ti film 21b and nitrogen-rich TiN film 21c is formed by the fourth film forming method. The thermal reaction Ti film 21a has a thickness of, for example, 1 nm or less, the plasma reaction Ti film 21b lying below has a thickness of, for example, 3 nm and the plasma reaction Ti film 21b lying above has a thickness of from 4 to 5 nm.

As in the first film forming method, the contact resistance of the thermal reaction Ti film 21a with the nickel silicide layer 18 can be made low and the nitrogen-rich TiN film 21c is effective as a barrier film for suppressing or preventing diffusion of constituent atoms of the plug. Moreover, in the process composed of Steps 5 and 6 and Steps 7, 8 and 9, the formation of the plasma reaction Ti film 21b and reduction can be carried out in a relatively short time so that owing to a decrease in the concentration of an impurity such as chlorine, the plasma reaction Ti film 21b having a low specific resistance and therefore having good quality is available.

The barrier metal film 21 having a low impurity concentration, for example, a low chlorine concentration can be formed by any one of the first to fourth film forming methods. This contributes to a decrease in the resistance of the nickel silicide layer 18 and prevention of peeling or microcracks of the barrier metal film 21.

The semiconductor wafer SW is then vacuum transferred from the barrier metal film forming chamber 56 (or chamber 57) to either one of the loadlock chambers 53 by the aid of the transfer robot 61 and is then returned to any one of the FOUPs 59 from the loadlock chamber 53 via the wafer carrying in-and-out chamber 58 by the aid of the transfer robot 62.

The barrier metal film 21 formed by any one of the first to fourth film forming methods is effective as a barrier film for suppressing or preventing diffusion of constituent atoms of the plug and has the nitrogen-rich TiN film 21c. The barrier metal film 21 may be imparted with a higher barrier function by forming thereover a titanium nitride film (second metal nitride film) having a thickness of, for example, from 0 to 5 nm by thermal CVD at from about 450 to 480° C. while using, for example, a $TiCl_4$ gas and an $NH_3$ gas (fourth reaction gas). The film forming method of the titanium nitride film to be formed over the barrier metal film 21 by thermal CVD will hereinafter be described briefly with reference to FIG. 14. This titanium nitride film may be formed in another chamber connected to the above-described film forming apparatus 50. Alternatively, it may be formed using a CVD apparatus different from the above described film forming apparatus 50. The film forming method of the titanium nitride film is not limited to the following one but various modifications thereof can be employed.

[Step 1] A semiconductor wafer SW is placed on a stage heated to a predetermined temperature, for example, 480° C. by a heater. During from Step 1 to Step 12, the stage is constantly heated to the predetermined temperature. A $TiCl_4$ gas and $NH_3$ gas and carrier gases thereof, that is, $N_2$ gas and $NH_3$ gas are introduced into the chamber so that the pressure in the chamber will be a predetermined one by an exhaust mechanism within a time set in Step 1. [Step 2] After the pressure and the flow rates of the $N_2$ gas and $NH_3$ gas become predetermined values, the wafer is heated for a predetermined time. [Step 3] At the same time, a $TiCl_4$ gas is supplied from a supply source of a $TiCl_4$ gas and the $TiCl_4$ gas is diverted just upstream of the chamber until the flow rate becomes stable.

[Step 4] to [Step 10] A $TiCl_4$ gas and an $NH_3$ gas are introduced simultaneously into the chamber when a titanium nitride film is deposited by using these gases. The flow rates of the $TiCl_4$ gas and $NH_3$ gas are, for example, 60 sccm, pressure is, for example, 260 Pa, and deposition time is, for example, 6 seconds. When a thick titanium nitride film is formed, steps from [Step 4] to [Step 10] are performed multiple times. For example, a titanium nitride film of 5 nm thick can be formed by conducting steps from [Step 4] to [Step 10] six times.

[Step 11] and [Step 12] The application of a high frequency voltage is stopped, the introduction of the $TiCl_4$ gas and $NH_3$ gas into the chamber is stopped, an $N_2$ gas is introduced into the chamber, and the $TiCl_4$ gas and $NH_3$ gas are discharged from the chamber. The introduction of the $N_2$ gas into the chamber is then stopped and the chamber is vacuumed.

As illustrated in FIG. 15, a tungsten film 22 is deposited by CVD over the main surface of the semiconductor substrate 1 including the inside of the connecting hole 20. In forming the tungsten film 22, a nucleation film of tungsten (which will hereinafter be called "tungsten nucleation film"; metal nucleation film) 22a is formed over the barrier metal film 21, followed by the deposition of a tungsten film (which will hereinafter be called "blanket•tungsten film"; metal film) 22b for filling the connecting hole 20 therewith. In the present Embodiment, the tungsten nucleation film 22a thus formed has a multilayer structure having a thickness of, for example, 10 nm or less. The tungsten nucleation film 22a exhibits good adhesion with the nitrogen-rich TiN film 21c located as the uppermost layer of the barrier metal film 21 and has a function of suppressing or preventing penetration of fluorine contained in a $WF_6$ gas, a gas for forming the tungsten film, into the barrier metal film 21 so that corrosion (for example, blister or peeling of the plasma reaction Ti film 21b) of the barrier metal film 21 by fluorine can be avoided.

The first, second and third formation methods of the tungsten film 22 will hereinafter be described. In the first film forming method, after simultaneous supply of a $WF_6$ gas, $SiH_4$ gas and $H_2$ gas into a chamber, a tungsten nucleation film 22a and a blanket•tungsten film 22b are formed successively. In the second film forming method, after adsorption of tungsten and fluorine to the surface of the barrier metal film 21 by using a WF$_6$ gas, fluorine is removed by the reduction reaction using an SiH$_4$ gas to form a tungsten nucleation film 22a, followed by the formation of a blanket•tungsten film 22b. In the third film forming method, after adsorption of tungsten and fluorine to the surface of the barrier metal film 21 by using a WF$_6$ gas, fluorine is removed by the reduction reaction using a B$_2$H$_6$ gas to form a tungsten nucleation film 22a, followed by the formation of a blanket•tungsten film 22b. The film forming method of the tungsten film 22 (tungsten nucleation film 22a and blanket•tungsten film 22b) is not limited to the above-described ones and various modifications thereof can be employed.

The first film forming method is performed as described below, for example, in accordance with the process step shown in FIG. 16.

[Step 1] and [Step 2] A tungsten nucleation film 22a having a predetermined thickness (A1) is formed over the surface of the barrier metal film 21 by introducing a WF$_6$ gas (fifth reaction gas), SiH$_4$ gas and H$_2$ gas (first reducing gas) at respective predetermined flow rates. The pressure in the chamber and the temperature of the semiconductor wafer are set at, for example, 2667 Pa and 390° C., respectively. By controlling the time (A1) of Step 2, a tungsten nucleation film 22a having a desired thickness can be formed. The tungsten nucleation film 22a has a thickness of, for example, 7 nm. By the simultaneous introduction of a WF$_6$ gas and SiH$_4$ gas into the chamber, film formation and removal of fluorine can be accomplished simultaneously so that a tungsten nucleation film 22a having a small fluorine content can be formed.

[Step 3] to [Step 6] After introduction of an H$_2$ gas (second reducing gas) into the chamber at a predetermined flow rate, a WF$_6$ gas (sixth reaction gas) is introduced into the chamber at a predetermined flow rate, for example, 250 sccm, whereby a blanket•tungsten film 22b is formed over the tungsten nucleation film 22a by H$_2$ reduction. The pressure in the chamber and the temperature of the semiconductor wafer are set at, for example, 10666 Pa and 400° C. or less, for example, 390° C., respectively. By controlling the time (A2) of Step 5, a blanket•tungsten film 22b having a desired thickness can be formed. The blanket•tungsten film 22b has a thickness of, for example, 193 nm. After formation of the blanket•tungsten film 22b, the pressure and flow rate of the WF$_6$ gas are reduced to 0 Pa and 0 sccm, respectively.

By the first film forming method adopting nucleation by the SiH$_4$ reduction, the tungsten film 22 composed of the tungsten nucleation film 22a and blanket•tungsten film 22b and having a small fluorine content can be formed. The film forming temperature of the blanket•tungsten film 22b is, for example, 390° C. Formation of the tungsten film 22 at a relatively low temperature not greater than 400° C. makes it possible to suppress penetration of fluorine contained in the WF$_6$ gas at the time of formation of the blanket•tungsten film 22b. Penetration of fluorine contained in the WF$_6$ gas into the barrier metal film 21 can therefore be suppressed or prevented so that corrosion of the barrier metal film 21 by fluorine can be prevented.

The second film forming method is performed as described below, for example, in accordance with the process step shown in FIG. 17.

[Step 1] and [Step 2] A WF$_6$ gas (fifth reaction gas) is introduced into the chamber at a predetermined flow rate, for example, 160 sccm to cause adsorption of tungsten and fluorine to the surface of the barrier metal film 21 and a tungsten nucleation film of about 1 nm thick is formed. The pressure in the chamber is, for example, 1000 Pa and the temperature of the semiconductor wafer is, for example, 350° C. The supply of the WF$_6$ gas into the chamber is then stopped.

[Step 3] and [Step 4] An SiH$_4$ gas (first reducing gas) is introduced into the chamber at a predetermined flow rate, for example, 400 sccm and fluorine in the tungsten nucleation film is removed by SiH$_4$ reduction. The pressure in the chamber is, for example, 1000 Pa and the temperature of the semiconductor wafer is, for example, 350° C. The supply of the SiH$_4$ gas into the chamber is then stopped. Steps from [Step 1] to [Step 4] is performed multiple times, for example, seven times to form a tungsten nucleation film 22a having a multilayer structure. The tungsten nucleation film 22a has a thickness of, for example, 7 nm. [Step 5] to [Step 9] After introduction of an H$_2$ gas (second reducing gas) into the chamber at a predetermined flow rate, for example, 4000 sccm, a WF$_6$ gas (sixth reaction gas) is introduced into the chamber at a predetermined flow rate, for example, 60 sccm. The flow rate of the WF$_6$ gas is then increased to, for example, 350 sccm and the pressure is raised to, for example, 10666 Pa. The temperature of the semiconductor wafer is also raised but is set at 400° C. or less, for example, 390° C. A blanket•tungsten film 22b is then formed over the tungsten nucleation film 22a by making use of H$_2$ reduction. After formation of the blanket•tungsten film 22b having a desired thickness, the pressure and flow rate of the WF$_6$ gas are reduced to 0 Pa and 0 sccm, respectively. The tungsten nucleation film 22a has a thickness of, for example, 193 nm.

By the second film forming method employing nucleation by SiH$_4$ reduction, the tungsten film 22 composed of the tungsten nucleation film 22a and blanket•tungsten film 22b is formed. Since the tungsten nucleation film 22a has a multilayer structure, the interface between layers becomes discontinuous, which disturbs easy penetration, through the tungsten nucleation film 22a, of fluorine contained in the WF$_6$ gas at the time of forming the blanket•tungsten film 22b. In addition, the film formation temperature of the blanket•tungsten film 22b is, for example, 390° C. Formation of the tungsten film 22 at a relatively low temperature not greater than 400° C. makes it possible to prevent penetration of fluorine contained in the WF$_6$ gas at the time of forming the blanket•tungsten film 22b. Penetration, into the barrier metal film 21, of fluorine contained in the WF$_6$ gas can therefore be suppressed or prevented so that corrosion of the barrier metal film 21 by fluorine can be prevented.

The third film forming method will be performed as described below, for example, in accordance with the process step shown in FIG. 18.

[Step 1] and [Step 2] A tungsten nucleation film having a thickness of about 1 nm is formed by introducing a WF$_6$ gas into a chamber at a predetermined flow rate, for example, 160 sccm and causing adsorption of tungsten and fluorine to the surface of the barrier metal film 21. The pressure in the chamber is, for example, 1000 Pa and the temperature of the semiconductor is, for example, 350° C. Supply of the WF$_6$ gas into the chamber is then terminated.

[Step 3] and [Step 4] A 5% B$_2$H$_6$ gas (first reducing gas) diluted with an H$_2$ gas is introduced into the chamber at a predetermined flow rate, for example, 1000 sccm and fluorine in the tungsten nucleation film is removed by B$_2$H$_6$ reduction. The pressure in the chamber is, for example, 1000 Pa and the temperature of the semiconductor wafer is, for example, 350° C. Supply of the 5% B$_2$H$_6$ gas diluted with an H$_2$ into the chamber is then terminated. Steps from [Step 1] to [Step 4] are performed in multiple times, for example, eight times, whereby a tungsten nucleation film 22a having a multilayer structure is formed. The tungsten nucleation film 22a has a thickness of, for example, 7 nm and it has an amorphous structure.

[Step 5] to [Step 10] After introduction of an $H_2$ gas (second reducing gas) into the chamber at a predetermined flow rate, for example, 4000 sccm, a $WF_6$ gas (sixth reaction gas) is introduced into the chamber at a predetermined flow rate, for example, 60 sccm. The flow rate of the $WF_6$ gas and pressure in the chamber are increased to, for example, 200 sccm and 10666 Pa, respectively. The temperature of the semiconductor wafer is also increased, but it is not greater than 400° C. and it is, for example, 390° C. A blanket•tungsten film 22b is formed over the tungsten nucleation film 22a by making use of $H_2$ reduction. After formation of the blanket•tungsten film 22b having a desired thickness, the pressure and flow rate of the $WF_6$ gas are decreased to 0 Pa and 0 sccm, respectively. The blanket•tungsten film 22b has a thickness of, for example, 193 nm.

In accordance with the third film forming method employing the nucleation by $B_2H_6$ reduction, the tungsten film 22 composed of the tungsten nucleation film 22a and blanket•tungsten film 22b is formed. Similar to the second film forming method employing the nucleation by $SiH_4$ reduction, the multilayer structure of the tungsten nucleation film 22a makes the interface between layers discontinuous. In addition, the amorphous structure of the tungsten nucleation film 22a disturbs penetration of fluorine, which has been contained in the $WF_6$ gas at the time of formation of the blanket•tungsten film 22b, through the tungsten nucleation film 22a. Moreover, the blanket•tungsten film 22b is formed at, for example, 390° C. The formation of the tungsten film 22 at a relatively low temperature not greater than 400° C. makes it possible to prevent penetration of fluorine which has been contained in the $WF_6$ gas at the time of formation of the blanket•tungsten film 22b. These enable suppression or prevention of penetration of fluorine contained in the $WF_6$ gas into the barrier metal film 21, resulting in the prevention of corrosion of the barrier metal film 21 by fluorine.

Figure 19:
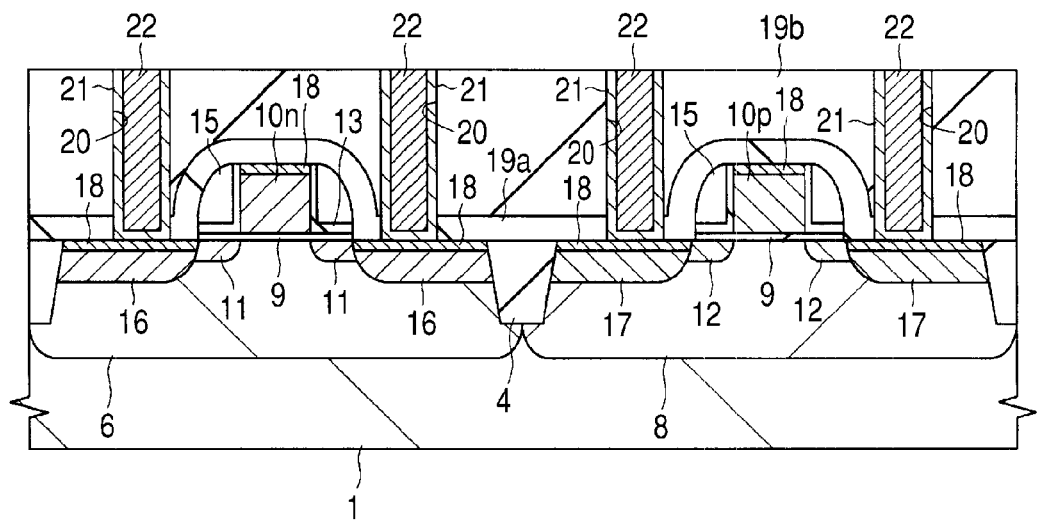
FIG. 19 is a fragmentary enlarged cross-sectional view of the same portion in FIG. 1 during a manufacturing step of the CMOS device following that of FIG. 15.

As illustrated in FIG. 19, the surface of the tungsten film 22 is planarized, for example, by CMP to fill the tungsten film 22 in the connecting hole 20, whereby a plug having the tungsten film 22 as a main conductive material is formed.

In the step of forming the plug inside of the connecting hole 20, the tungsten film 22 is used as a main conductive material of the plug and a film stack obtained by forming a titanium nitride film 21c on the titanium films 21a and 21b is used as the barrier metal film 21. The materials of the plug and barrier metal film are not limited to them but various modifications of them are usable. For example, it is possible to use the above-described barrier metal film 21 as the barrier metal film and a copper film as the main conductive material of the plug. In this case, the barrier metal film 21 is formed in a similar manner to the above-described one. A seed layer, for example, a seed layer of copper or ruthenium is then formed over the barrier metal film 21 by CVD or sputtering, followed by the formation of a copper plated film over the seed layer by electroplating to fill the copper plated film in the connecting hole 20.

Figure 20:
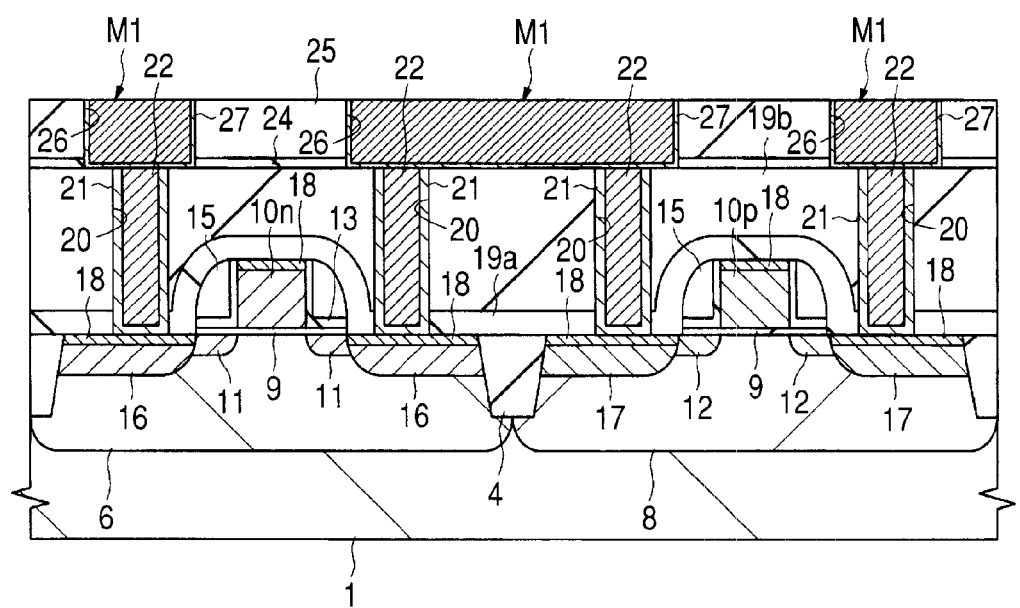
FIG. 20 is a fragmentary enlarged cross-sectional view of the same portion in FIG. 1 during a manufacturing step of the CMOS device following that of FIG. 19.

As illustrated in FIG. 20, a stopper insulating film 24 and an insulating film 25 for interconnect formation are formed successively over the main surface of the semiconductor substrate 1. The stopper insulating film 24 is a film which will serve as an etching stopper when a trench is formed in the insulating film 25 and a material having an etch selectivity relative to the insulating film 25 is employed. The stopper insulating film 24 may be, for example, a silicon nitride film formed by plasma CVD and the insulating film 25 may be, for example, a silicon oxide film formed by plasma CVD. In the stopper insulating film 24 and insulating film 25, a first-level interconnect which will be described next is formed.

In the next place, the first-level interconnect is formed by the single damascene process. First, dry etching with a resist pattern as a mask is performed to form a wiring trench 26 in a predetermined region of the stopper insulating film 24 and insulating film 25, followed by the formation of a barrier metal film 27 over the main surface of the semiconductor substrate 1. The barrier metal film 27 is, for example, a film of a titanium nitride film, a film of tantalum nitride film, a film stack obtained by stacking a tantalum film over a tantalum nitride film, or a film stack obtained by stacking a ruthenium film over a tantalum nitride film. A copper seed layer is then formed over the barrier metal film 27 by CVD or sputtering, followed by formation of a copper plated film over the seed layer by electroplating. The wiring trench 26 is then filled with the copper plated film. The copper plated film, seed layer and barrier metal film 27 in a region outside the wiring trench 26 are then removed, whereby a first-level interconnect M1 having a copper film as a main conductive material is formed.

Figure 21:
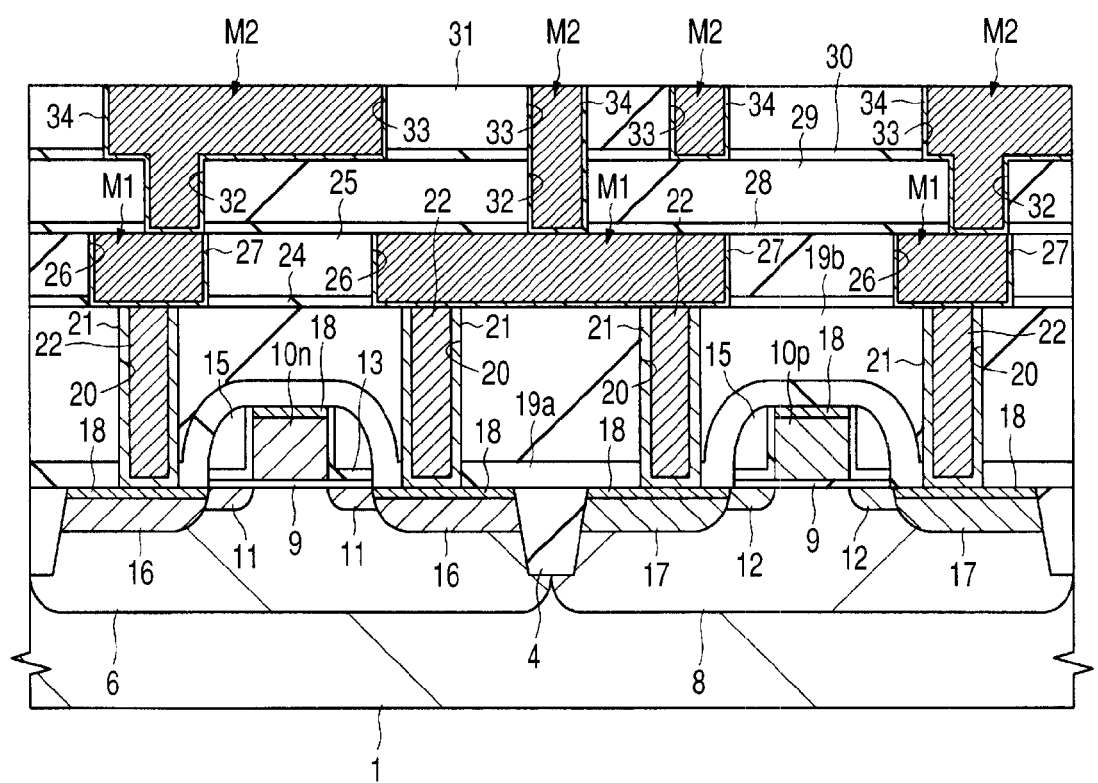
FIG. 21 is a fragmentary enlarged cross-sectional view of the same portion illustrated in FIG. 1 during a manufacturing step of the CMOS device following that of FIG. 20.

A second-level interconnect is then formed by the dual damascene process. As illustrated in FIG. 21, a cap insulating film 28, an interlayer insulating film 29 and a stopper insulating film 30 for interconnect formation are then formed successively over the main surface of the semiconductor substrate 1. In the cap insulating film 28 and interlayer insulating film 29, a connecting hole is formed as will be described later. The cap insulating film 28 is made of a material having an etch selectivity relative to the interlayer insulating film 29 and it may be, for example, a silicon nitride film formed by plasma CVD. The cap insulating film 28 has a function as a protecting film for preventing diffusion of copper constituting the first-level interconnect M1. The interlayer insulating film 29 may be, for example, a TEOS film formed by plasma CVD. The stopper insulating film 30 is made of an insulating material having an etch selectivity relative to the interlayer insulating film 29 and an insulating film for interconnect formation which will be deposited later over the stopper insulating film 30. It may be, for example, a silicon nitride film formed by plasma CVD.

After dry etching of the stopper insulating film 30 with a resist pattern for hole formation as a mask, an insulating film 31 for interconnect formation is formed over the stopper insulating film 30. The insulating film 31 may be, for example, a TEOS film.

The insulating film 31 is dry etched with a resist pattern for forming a wiring trench as a mask. The stopper insulating film 30 functions as an etching stopper for this dry etching. The interlayer insulating film 29 is then dry etched with the stopper insulating film 30 and resist pattern for wiring trench formation as a mask. The cap insulating film 28 functions as an etching stopper for this dry etching. The cap insulating film 28 thus exposed is removed by dry etching. Then, connecting holes 32 are formed in the cap insulating film 28 and interlayer insulating film 29, while wiring trenches 33 are formed in the stopper insulating film 30 and insulating film 31.

A second-level interconnect is then formed in the connecting hole 32 and wiring trench 33. The second-level interconnect is made of a barrier metal layer and a copper film serving as a main conductive material. A connecting member for connecting the second-level interconnect to the first-level interconnect M1 which lies therebelow is integrally formed with the second-level interconnect. First, a barrier metal film 34 is formed over the main surface of the semiconductor substrate 1 including the insides of the connecting hole 32 and wiring trench 33. The barrier metal film 34 is, for example, a film of a titanium nitride film, a film of tantalum nitride film, a film stack obtained by stacking a tantalum film over a tantalum nitride film, or a film stack obtained by stacking a ruthenium film over a tantalum nitride film. Prior to the formation of the barrier metal film 34, the above-described dry cleaning treatment is performed. This dry cleaning treatment is also followed by heating of the semiconductor wafer at a temperature of from 100 to 150° C. and heating at a temperature higher than 150° C. in order to remove products from the bottom surface of the connecting hole 32 and sidewalls of the connecting hole 32 and wiring trench 33. This makes it possible to reduce variations in the contact resistance between the barrier metal film 34 and first-level interconnect M1 and also prevent peeling of the barrier metal film 34 from the cap insulating film 28, interlayer insulating film 29, stopper insulating film 30 and insulating film 31. A copper seed layer is then formed over the barrier metal film 34 by CVD or sputtering, followed by the formation of a copper plated film over the seed layer by electroplating. The copper plated film is filled in the connecting hole 32 and wiring trench 33. The copper plated film, seed layer and barrier metal film 34 in a region outside the connecting hole 32 and wiring trench 33 are then removed to form a second-level interconnect M2 having the copper film as a main conductive material.

Figure 22:
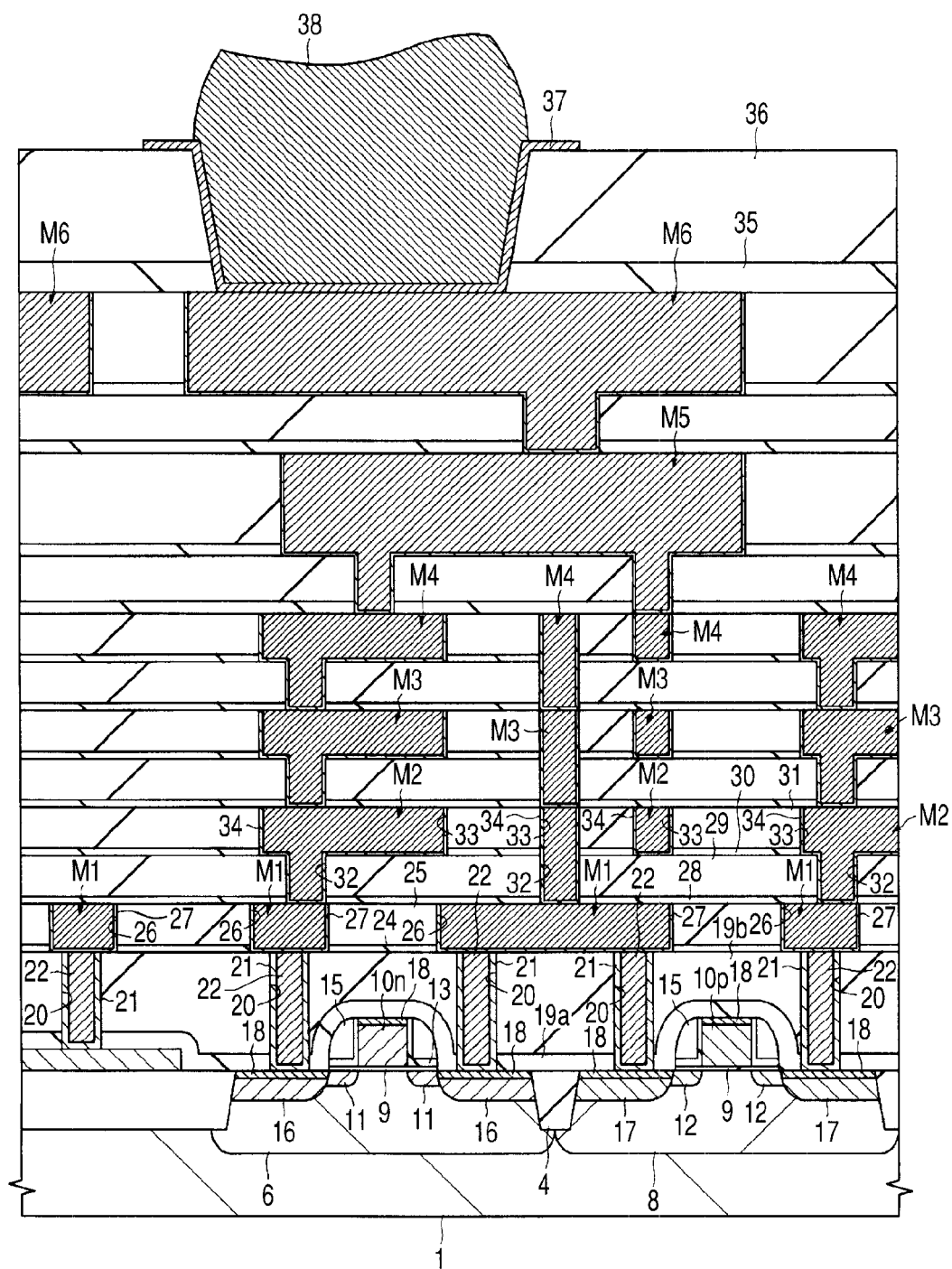
FIG. 22 is a fragmentary enlarged cross-sectional view of the same portion in FIG. 1 during a manufacturing step of the CMOS device following that of FIG. 21.

As illustrated in FIG. 21, in a similar manner to that employed for the formation of the second-level interconnect M2, upper-level interconnects are formed. FIG. 22 illustrates a CMOS device having the third-level to sixth-level interconnects M3, M4, M5 and M6 formed therein. A silicon nitride film 35 is formed over the sixth-level interconnect M6, followed by the formation of a silicon oxide film 36 over the silicon nitride film 35. These silicon nitride film 25 and silicon oxide film 36 function as a passivation film for preventing penetration of water and impurities from the outside and also controlling the penetration of an α-ray.

The silicon nitride film 35 and silicon oxide film 36 are etched with a resist pattern as a mask, whereby a portion (bonding pad portion) of the sixth-level interconnect M6 is exposed. A bump bottom electrode 37 made of a film stack of a gold film, nickel film and the like is formed over the thus-exposed sixth-level interconnect M6 and a bump electrode 38 made of gold, solder or the like is formed over the bump bottom electrode 37, whereby a CMOS device according to Embodiment 1 is substantially completed. This bump electrode 38 will be an electrode for external connection. The semiconductor wafer SW is then sliced into individual semiconductor chips and they are each mounted on a package substrate, whereby a semiconductor device is completed. Description on them is however omitted.

According to this Embodiment, by the dry cleaning conducted prior to the formation of the barrier metal film 21 in the connecting hole 20, a product a little different from its stoichiometric composition remains on the bottom and side surfaces of the connecting hole 20. This product is however removed by the heat treatment, after the dry cleaning treatment, at a temperature higher than 150° C. so that variations in the contact resistance between the nickel silicide layer 18 and barrier metal film 21 on the bottom surface of the connecting hole 20 can be decreased and peeling of the barrier metal film 21 from the side surface of the connecting hole 20 can be prevented.

Moreover, the thermal reaction Ti film 21a having a low concentration of an impurity such as chlorine can be formed as an undermost layer of the barrier metal film 21 to be brought into contact with the nickel silicide layer 18 and the concentration of an impurity, such as chlorine, contained in the barrier metal film 21 can be reduced by the plasma treatment with an $H_2$ gas so that the barrier metal film 21 having a low contact resistance with the nickel silicide layer 18 and free of defects such as peeling and microcracks can be obtained. Moreover, diffusion of constituent atoms of the plug can be suppressed or prevented by forming the nitrogen-rich TiN film 21c as the uppermost layer of the barrier metal film 21 contiguous to the plug.

In addition, by forming the tungsten nucleation film 22a having a multilayer structure as a layer of the tungsten film 22 contiguous to the barrier metal film 21 constituting the plug while making use of an $SiH_4$ reduction reaction or $B_2H_6$ reduction reaction, adhesion between the tungsten film 22 and nitrogen-rich TiN film 21c can be improved. Since the tungsten nucleation film 22a has a function of suppressing the penetration of fluorine contained in the $WF_6$ gas, and the blanket•tungsten film 22b is formed making use of $H_2$ reduction, the tungsten film 22 can be formed at a relatively low temperature not greater than 400° C. As a result, penetration of fluorine contained in the $WF_6$ gas into the barrier metal film 21 can be suppressed or prevented and corrosion of the barrier metal film 21 with fluorine can therefore be prevented.

Moreover, the film forming apparatus 50 is equipped with two chambers 56 and 57 equal in function and structure for the formation of a barrier metal film so that even if one of the chambers, for example, the chamber 56 is stopped, formation of a titanium film or titanium nitride film can be continued by using the other chamber, for example, the chamber 57 without stopping the film forming apparatus 50. The film forming apparatus 50 can therefore have an improved operation rate.

The present invention made by the present inventors has been described so far based on its embodiment. It should however be borne in mind that the invention is not limited to or by the embodiment but can be changed without departing from the scope of the invention.

The present invention can be applied to the manufacture of a semiconductor device having a step of filling a metal film in a connecting hole opened in an insulating film.

What is claimed is:

1. A manufacturing method of a semiconductor device comprising: forming an insulating film over the main surface of a semiconductor wafer; and filling, via a barrier metal film, a metal film in a connecting hole opened in the insulating film, the method comprising, after opening the connecting hole in the insulating film, the steps of:
   (a) forming a first metal film over the bottom portion of the connecting hole by thermal reaction using a first reaction gas;
   (b) forming a second metal film over the first metal film by a plasma reaction using the first reaction gas; and
   (c) subjecting the surface of the second metal film to second plasma treatment by using a third reaction gas containing nitrogen to form a first metal nitride film over the surface of the second metal film.

2. A manufacturing method of a semiconductor device according to claim 1, wherein the first metal nitride film formed in the step (c) contains more nitrogen than that of the corresponding stoichiometric composition.

3. A manufacturing method of a semiconductor device according to claim 1, further comprising a step of:
   (d) between the steps (b) and (c), subjecting the surface of the second metal film to first plasma treatment by using a second reaction gas.

4. A manufacturing method of a semiconductor device according to claim 1, further comprising a step of:
   (e) after the step (c), forming a second metal nitride film over the first metal nitride film by thermal CVD using a fourth reaction gas.

5. A manufacturing method of a semiconductor device according to claim 1, wherein a $TiCl_4$ gas is employed as the first reaction gas.

6. A manufacturing method of a semiconductor device according to claim 3, wherein an $H_2$ gas is employed as the second reaction gas.

7. A manufacturing method of a semiconductor device according to claim 1, wherein an $NH_3$ gas is employed as the third reaction gas.

8. A manufacturing method of a semiconductor device according to claim 4, wherein a $TiCl_4$ gas and an $NH_3$ gas are employed as the fourth reaction gas.

9. A manufacturing method of a semiconductor device according to claim 1, wherein the step (b) is performed plural times.

10. A manufacturing method of a semiconductor device according to claim 1, wherein the step (b) and step (c) are performed plural times.

11. A manufacturing method of a semiconductor device according to claim 1, further comprising a step of:
(f) prior to the step (a), dry cleaning the bottom portion of the connecting hole with a seventh reaction gas.

12. A manufacturing method of a semiconductor device according to claim 11, wherein the seventh reaction gas contains at least one of an HF gas, $NF_3$ gas, $NH_3$ gas and $H_2$ gas.

13. A manufacturing method of a semiconductor device according to claim 11, further comprising a step of:
(g) between the steps (f) and (a), heat treating the semiconductor wafer.

14. A manufacturing method of a semiconductor device according to claim 1, wherein the bottom portion of the connecting hole is opened over a nickel silicide layer, nickel alloy silicide layer, cobalt silicide layer, tungsten silicide layer or platinum silicide layer.

15. A manufacturing method of a semiconductor device comprising: forming an insulating film over the main surface of a semiconductor wafer; and filling, via a barrier metal film, a metal film in a connecting hole opened in the insulating film, the method comprising, after opening the connecting hole in the insulating film, the steps of:
(a) placing the semiconductor wafer on a wafer stage of a first chamber, thereafter, supplying a seventh reaction gas into the first chamber and dry cleaning the bottom portion of the connecting hole;
(b) placing the semiconductor wafer on a wafer stage of a second chamber and then heat treating the semiconductor wafer;
(c) placing the semiconductor wafer on a wafer stage of a third chamber;
(d) forming a first metal film over the bottom portion of the connecting hole by a thermal reaction using a first reaction gas;
(e) forming a second metal film over the first metal film by a plasma reaction using the first reaction gas; and
(f) subjecting the surface of the second metal film to second plasma treatment by using a third reaction gas containing nitrogen to form a first metal nitride film over the surface of the second metal film,
wherein the step (d), (e) and (f) are performed in the third chamber.

16. A manufacturing method of a semiconductor device according to claim 15, wherein the first metal nitride film formed in the step (f) contains more nitrogen than that of the corresponding stoichiometric composition.

17. A manufacturing method of a semiconductor device according to claim 15, further comprising a step of:
(g) between the steps (e) and (f), subjecting the surface of the second metal film to first plasma treatment using a second reaction gas.

18. A manufacturing method of a semiconductor device according to claim 15, wherein a $TiCl_4$ gas is employed as the first reaction gas.

19. A manufacturing method of a semiconductor device according to claim 17, wherein an $H_2$ gas is employed as the second reaction gas.

20. A manufacturing method of a semiconductor device according to claim 15, wherein an $NH_3$ gas is employed as the third reaction gas.

21. A manufacturing method of a semiconductor device according to claim 15, wherein the seventh reaction gas contains at least one of an HF gas, $NF_3$ gas, $NH_3$ gas and $H_2$ gas.

22. A manufacturing method of a semiconductor device according to claim 15, wherein the step (e) is performed plural times.

23. A manufacturing method of a semiconductor device according to claim 15, wherein the step (e) and step (f) are performed plural times.

24. A manufacturing method of a semiconductor device according to claim 15, wherein the bottom portion of the connecting hole is opened over a nickel silicide layer, nickel alloy silicide layer, cobalt silicide layer, tungsten silicide layer or platinum silicide layer.

25. A manufacturing method of a semiconductor device comprising: forming an insulating film over the main surface of a semiconductor wafer; and filling, via a barrier metal film, a metal film in a connecting hole opened in the insulating film, the method comprising, after opening the connecting hole in the insulating film, the steps of:
(a) forming a second metal film over the bottom portion of the connecting hole by a plasma reaction using a first reaction gas;
(b) forming a first metal nitride film over the surface of the second metal film by subjecting the surface of the second metal film to second plasma treatment by using a third reaction gas containing nitrogen;
(c) forming a metal nucleation film over the first metal nitride film by CVD using a fifth reaction gas and first reducing gas; and
(d) forming the metal film over the metal nucleation film by CVD using a sixth reaction gas and a second reducing gas.

26. A manufacturing method of a semiconductor device according to claim 25, wherein in the step (c), after formation of the metal nucleation film over the first metal nitride film by CVD using the fifth reaction gas, reduction of the metal nucleation film by using the first reducing gas is performed plural times.

27. A manufacturing method of a semiconductor device according to claim 25, wherein the temperature of the semiconductor wafer in the step (d) is 400° C. or less.

28. A manufacturing method of a semiconductor device according to claim 25, wherein the fifth reaction gas contains a $WF_6$ gas and the first reducing gas contains an $SiH_4$ gas.

29. A manufacturing method of a semiconductor device according to claim 25, wherein the fifth reaction gas contains a $WF_6$ gas and the first reducing gas contains a $B_2H_6$ gas.

30. A manufacturing method of a semiconductor device according to claim 29, wherein the metal nucleation film has an amorphous structure.

31. A manufacturing method of a semiconductor device according to claim 25, wherein the sixth reaction gas contains a $WF_6$ gas and the second reducing gas contains an $H_2$ gas.

32. A manufacturing method of a semiconductor device according to claim 25, wherein the metal nucleation film has a thickness not greater than 10 nm.

33. A manufacturing method of a semiconductor device according to claim 25, wherein the first metal nitride film formed in the step (b) contains more nitrogen than that of the corresponding stoichiometric composition.

34. A manufacturing method of a semiconductor device according to claim 25, further comprising a step of:
(e) between the steps (a) and (b), subjecting the surface of the second metal film to first plasma treatment by using a second reaction gas.

35. A manufacturing method of a semiconductor device according to claim 25, further comprising a step of:
(f) between the steps (b) and (c), forming a second metal nitride film over the first metal nitride film by thermal CVD using a fourth reaction gas.

36. A manufacturing method of a semiconductor device according to claim 25, wherein a $TiCl_4$ gas is employed as the first reaction gas.

37. A manufacturing method of a semiconductor device according to claim 34, wherein an $H_2$ gas is employed as the second reaction gas.

38. A manufacturing method of a semiconductor device according to claim 25, wherein an $NH_3$ gas is employed as the third reaction gas.

39. A manufacturing method of a semiconductor device according to claim 35, wherein a $TiCl_4$ gas and an $NH_3$ gas are employed as the fourth reaction gas.

40. A manufacturing method of a semiconductor device comprising: forming an insulating film over the main surface of a semiconductor wafer; and filling, via a barrier metal film, a metal film in a connecting hole opened in the insulating film, the method comprising, after opening the connecting hole in the insulating film, the steps of:
(a) forming a second metal film over the bottom portion of the connecting hole by a plasma reaction using a first reaction gas;
(b) subjecting the surface of the second metal film to second plasma treatment by using a third reaction gas containing nitrogen to form a first metal nitride film over the surface of the second metal film;
(c) forming a seed layer over the first metal nitride film; and
(d) forming the metal film over the seed layer by plating.

41. A manufacturing method of a semiconductor device according to claim 40, wherein the metal film is copper.

42. A manufacturing method of a semiconductor device according to claim 40, wherein the first metal nitride film formed in the step (b) contains more nitrogen than that of the corresponding stoichiometric composition.

43. A manufacturing method of a semiconductor device according to claim 40, further comprising a step of:
(e) between the steps (a) and (b), subjecting the surface of the second metal film to first plasma treatment by using a second reaction gas.

44. A manufacturing method of a semiconductor device according to claim 40, further comprising a step of:
(e) between the steps (b) and (c), forming a second metal nitride film over the first metal nitride film by thermal CVD using a fourth reaction gas.

45. A manufacturing method of a semiconductor device according to claim 40, wherein a $TiCl_4$ gas is employed as the first reaction gas.

46. A manufacturing method of a semiconductor device according to claim 43, wherein an $H_2$ gas is employed as the second reaction gas.

47. A manufacturing method of a semiconductor device according to claim 40, wherein an $NH_3$ gas is employed as the third reaction gas.

48. A manufacturing method of a semiconductor device according to claim 44, wherein a $TiCl_4$ gas and an $NH_3$ gas are employed as the fourth reaction gas.

\* \* \* \* \*